United States Patent
Nakagawa et al.

(10) Patent No.: US 12,196,791 B2
(45) Date of Patent: Jan. 14, 2025

(54) SIGNAL PROCESSING SYSTEM AND SIGNAL PROCESSING METHOD

(71) Applicant: Hitachi, Ltd., Tokyo (JP)

(72) Inventors: Shinji Nakagawa, Tokyo (JP); Soichiro Tanaka, Tokyo (JP); Masato Kunitomo, Tokyo (JP); Kazuaki Tokunaga, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 169 days.

(21) Appl. No.: 18/118,399

(22) Filed: Mar. 7, 2023

(65) Prior Publication Data
US 2023/0400486 A1 Dec. 14, 2023

(30) Foreign Application Priority Data
Jun. 10, 2022 (JP) .................................. 2022-094660

(51) Int. Cl.
*G01R 23/02* (2006.01)
(52) U.S. Cl.
CPC .................... *G01R 23/02* (2013.01)
(58) Field of Classification Search
CPC ...... G01R 13/342; G01R 17/04; G01R 19/20; G01R 19/2506; G01R 29/02
See application file for complete search history.

(56) References Cited

U.S. PATENT DOCUMENTS

| 2016/0239401 A1* | 8/2016 | Li | G06F 11/3608 |
| 2021/0010950 A1* | 1/2021 | Kito | G06F 11/36 |

FOREIGN PATENT DOCUMENTS

WO 2021/149614 A1 7/2021

* cited by examiner

*Primary Examiner* — Tung X Nguyen
(74) *Attorney, Agent, or Firm* — Procopio, Cory, Hargreaves & Savitch LLP

(57) ABSTRACT

A highly accurate feature extraction is performed on a signal with temporal variation in amplitude, and this signal is restored to detect a state of a transmission source (output source) of this signal to be normal or abnormal. A signal processing method includes: separating a signal X into an oscillation signal with a constant amplitude X1 and a signal with temporal variation in amplitude X2, the separating performed by a signal separator; performing processing of dimensionality reduction, compression, or the like, on the oscillation signal X1 so as to extract a feature value (information) included in the oscillation signal X1; and outputting a restored signal X1' that is restored from the oscillation signal X1 by performing processing inverse to the processing of dimensionality reduction, compression, or the like, based on the extracted feature value, performing the processing, the inverse processing, and the outputting performed by a signal X1 restorer.

16 Claims, 17 Drawing Sheets

SIGNAL PROCESSING SYSTEM AND SIGNAL PROCESSING METHOD

CROSS-REFERENCE TO RELATED APPLICATION

This application claims priority pursuant to 35 U.S.C. § 119 from Japanese Patent Application No. 2022-094660, filed on Jun. 10, 2022, the entire disclosure of which is hereby incorporated herein by reference.

BACKGROUND

Technical Field

The present invention relates to a signal processing system and a signal processing method, and particularly to a signal processing system and a signal processing method for an oscillation signal, and an anomaly detecting method using the same.

Related Art

As the background art of the present technique, there is International Publication No. WO 2021/149614 (Patent Literature 1). This Literature describes "a wire rope flaw detecting device including: a magnetizer that generates magnetic flux passing through a part of a wire rope; a magnetic sensor that generates, as a sensor signal, a signal corresponding to leakage magnetic flux of the magnetic flux, leaking from the wire rope; and a controller that processes the sensor signal, and the controller includes: a filtering unit that extracts a frequency component of the sensor signal; and a calculating unit that extracts a plurality of feature values based on a plurality of values constituting the frequency component; and a learning unit that determines presence or absence of damages in the wires by executing calculation processing by a learning model, which is already trained after being subjected to machine learning regarding the correlation between the plurality of feature values and the state of the wires included in the wire rope, when the plurality of feature values extracted by the calculating unit based on the plurality of values constituting the frequency component extracted by the filtering unit is input into this learning model already trained."

SUMMARY OF THE INVENTION

However, the above-described prior art (Patent Literature 1) uses a predetermined frequency component of the sensor signal as an input for the machine learning, and does not take into consideration temporal variation in amplitude.

In order to solve the above problems, for example, the configurations as set forth in the claims of the present application will be adopted. The present application includes a plurality of solutions to solve the above problems, and for example, the present application includes a signal processing method including:

separating a signal X into an oscillation signal with a constant amplitude X1 and a signal with temporal variation in amplitude X2, the separating being performed by a signal separator;

performing processing of dimensionality reduction, compression, or the like, on at least the oscillation signal X1 so as to extract a feature value (information) included in the oscillation signal X1; and outputting a restored signal X1' that is restored from the oscillation signal X1 by performing processing inverse to the processing of dimensionality reduction, compression, or the like, based on the extracted feature value (information), the processing, the inverse processing, and the outputting being performed by a signal X1 restorer.

For example, the signal processing method is characterized by further including:

performing the processing of dimensionality reduction, compression, or the like, on the oscillation signal X1 and the signal with temporal variation in amplitude X2 so as to extract feature values (information) included in the oscillation signal X1 and the signal with temporal variation in amplitude X2; and outputting the restored signal X1' restored from the oscillation signal X1 and a signal X2' restored from the oscillation signal X2 by performing processing inverse to the processing of dimensionality reduction, compression, or the like, based on the extracted feature values (information), the processing, the inverse processing, and the outputting being performed by a signal X1 and signal X2 restorer.

For example, the signal processing method is characterized by further including calculating a signal X' that is restored from the signal X based on the restored signal X1' restored from the oscillation signal X1 and the signal with temporal variation in amplitude X2, the calculating being performed by a signal X restorer.

For example, the signal processing method is characterized by further including:

performing the processing of dimensionality reduction, compression, or the like, on the oscillation signal X1 and the signal with temporal variation in amplitude X2 so as to extract feature values (information) included in the oscillation signal X1 and the signal with temporal variation in amplitude X2; and outputting the signal X1' that is restored from the oscillation signal X1 and a signal X2' that is restored from the signal with temporal variation in amplitude X2 by performing processing inverse to the processing of dimensionality reduction, compression, or the like, based on the extracted feature values (information), the processing, the inverse processing, and the outputting being performed by a signal X1 and signal X2 restorer; and calculating a restored signal X' that is restored from the signal X based on the restored signal X1' and the restored signal X2', the calculating being performed by a signal X restorer.

For example, the signal processing method is a signal processing method and an anomaly detecting method using the same, being characterized by further including:

calculating a difference D between the input signal X and the restored signal X', the calculating being performed by a difference calculator; and detecting the state of a transmission source (output source) of the signal X based on the difference D, the detecting being performed by a state detector.

For example, the signal processing method is characterized in that the difference D is at least:

an absolute value of a difference between the input signal X1 and the restored signal X1' at each time point, or a square value of a difference between the input signal X1 and the restored signal X1' at each time point, or an absolute value of a difference between the input signal X2 and the restored signal X2' at each time point, or a square value of a difference between the input signal X2 and the restored signal X2' at each time point, or an absolute value of a difference between the input signal X and the restored signal X' at each time point, or a square value of a difference between the input signal X and the restored signal X' at each time point.

For example, the signal processing method is characterized in that the difference D is at least:

a sum of an absolute value of a difference between the input signal X1 and the restored signal X1' at each time point, or a sum of a square value of a difference between the input signal X1 and the restored signal X1' at each time point, or a sum of an absolute value of a difference between the input signal X2 and the restored signal X2' at each time point, or a sum of a square value of a difference between the input signal X2 and the restored signal X2' at each time point, or a sum of an absolute value of a difference between the input signal X and the restored signal X' at each time point, or a sum of a square value of a difference between the input signal X and the restored signal X' at each time point.

For example, the signal processing method is characterized in that the signal X1 restorer includes an AE (auto encoder), a VAE (variational auto encoder), or PCA (principal component analysis).

For example, the signal processing method is characterized in that the oscillation waveform with a constant amplitude X1 is a signal obtained by modifying all amplitudes of the signal X to become the maximum amplitude of the signal X.

For example, the signal processing method is characterized in that the signal with temporal variation in amplitude X2 is a signal obtained by connecting respective amplitudes, each in one cycle, of the input signal X with a straight line.

For example, the signal processing method is characterized in that the signal with temporal variation in amplitude X2 is an envelope of the signal X.

For example, the signal processing method is characterized in that the oscillation waveform with a constant amplitude X1 and the signal with temporal variation in amplitude X2 are signals obtained by subjecting the input signal X to the Hilbert transform.

For example, the signal processing method is a signal processing method and an anomaly detecting method using the same, being characterized in that the state detector detects that a state of the transmission source of the signal X determines the state of the transmission source of the signal X having the difference D out of a predetermined range to be abnormal.

For example, the signal processing method is characterized in that when the amplitude of the signal X has an oscillation waveform varying arbitrarily, at least the signal X1 or the signal X1' has an amplitude smaller than the amount of variation in amplitude of the signal X.

For example, the signal processing method is characterized in that a time point or a period when the difference D is out of a predetermined range is set to an anomaly occurrence period.

For example, the signal processing method is characterized in that the signal X is drive current of an AC motor.

For example, the signal processing method is characterized in that the signal X is drive current of a motor attached to a driving part of a robot, or drive current of a motor for driving an electric vehicle.

According to the present invention, the signal X is separated into the oscillation signal with a constant amplitude X1 and the signal with temporal variation in amplitude X2, and the separated signals X1, X2 are used as input to machine learning represented by an AE or a VAE. At this time, the oscillation signal X1 has information on the frequency and temporal variation in frequency of the signal X, and the signal X2 has information on the amplitude and temporal variation in amplitude of the signal X. In this way, by separating the feature values into the temporal variation in frequency and the temporal variation in amplitude, respectively, it is possible for machine learning to learn the temporal variation in frequency and the temporal variation in amplitude, respectively, with higher accuracy.

As an application example using machine learning, there may be anomaly detection. For example, when using an AE or VAE, which is a kind of machine learning, the AE or VAE is trained with data in a normal state and thereby the AE/VAE learns essential information (feature values) of the normal data, and restores the normal data as the input, based on the feature values. When abnormal data (precisely, data never having been experienced during the training) is input to the AE or VAE after the training, a difference is likely to occur between data restored by the AE or VAE and the input data. Anomaly is detected based on the degree of this difference. For example, the inventors have discovered that an AE or VAE, especially a VAE does not easily progress in learning of feature values, in the case of an oscillation waveform varying in amplitude and frequency over time due to drive current of an AC motor. For latent space (an intermediate layer) representing a feature value acquired by a VAE, a Gaussian distribution is assumed, and for a waveform like an oscillation waveform with amplitude (distribution) varying over time, the VAE might be difficult to acquire feature values due to the structure thereof. It is conceivable that an AE has the same tendency as a VAE.

At this time, according to the present invention, the oscillation waveform X with temporal variation in amplitude is separated into an oscillation waveform X1 with a constant amplitude and a waveform having an amplitude varying over time (not oscillation waveform) X2, and only X1 is, or X1 and X2 are used as an input to the AE or VAE, to thereby solve the structural problem of the AE or VAE described above, and it is possible to learn the feature values with high accuracy. Furthermore, the separation processing is reversible, and the signal X can be restored by using the restored signal X1' from X1, and X2 or the restored signal X2' from X2. An anomaly can be detected based on the difference between X1 and X1', the difference between X2 and X2', or the difference between X and X'; and at this time, a period having a larger difference is compared with X, to thereby visualize the period (time point, time period), which is determined to be abnormal.

As describe above, according to the present invention, in machine learning that reproduces input data based on extracted features of input data of an AE, a VAE, or the like, it is possible to perform highly accurate feature extraction of a signal having an amplitude varying over time; therefore, it is possible to perform highly accurate anomaly detection using the above data, and to visualize the period (time point, time period) in which an anomaly occurs.

DETAILED DESCRIPTION OF THE EMBODIMENTS

Hereinafter, Embodiments will be described with reference to the drawings.

Embodiment 1

In the present Embodiment, there will be shown a signal processing system and a signal processing method that include: a signal separator (signal separating unit) that separates an input signal X (may also be referred to simply as a "signal X", hereinafter. Similarly, other signals may be appropriately represented in an abbreviated manner) into an oscillation signal with a constant amplitude X1 and a signal with temporal variation in amplitude X2; and a signal X1 restorer (signal X1 restoring unit) that performs processing of dimensionality reduction, compression, or the like, on at least an oscillation signal X1 so as to extract a feature value (information) included in the oscillation signal X1, and outputs a restored signal X1' that is restored from the oscillation signal X1 by performing processing inverse to the processing of dimensionality reduction, compression, or the like, on the above-processed oscillation signal X1 based on the extracted feature value (information).

The present signal processing system and the present signal processing method include: a signal X restorer (signal X restoring unit) that calculates a restored signal X' that is restored from the input signal X based on the restored signal X1' that is restored from the oscillation signal X1 and the signal with temporal variation in amplitude X2.

The present signal processing system and the present signal processing method include: a difference calculator (difference calculating unit) that calculates a difference D between the input signal X and the restored signal X'; and a state detector (state detecting unit) that detects the state of a transmission source (output source) of the signal X based on the difference D.

The difference D is an absolute value of a difference between the input signal X and the restored signal X' at each time point.

The signal X1 restorer includes an AE (auto encoder), a VAE (variational auto encoder), or PCA (principal component analysis).

The oscillation signal X1 having a waveform with a constant amplitude is a signal obtained by modifying all amplitudes of the signal X to become the maximum amplitude of the signal X.

The signal with temporal variation in amplitude X2 is a signal obtained by connecting respective amplitudes, each in one cycle, of the signal X with a straight line.

The state detector that detects the state of the transmission source of the signal X determines the state of the transmission source of the signal X having the difference D out of a predetermined range to be abnormal.

When the amplitude of the signal X has an oscillation waveform varying arbitrarily, at least the signal X1 or the signal X1' has an amplitude smaller than the amount of variation in amplitude of the signal X.

The signal X is drive current of an AC motor.

Figure 1:
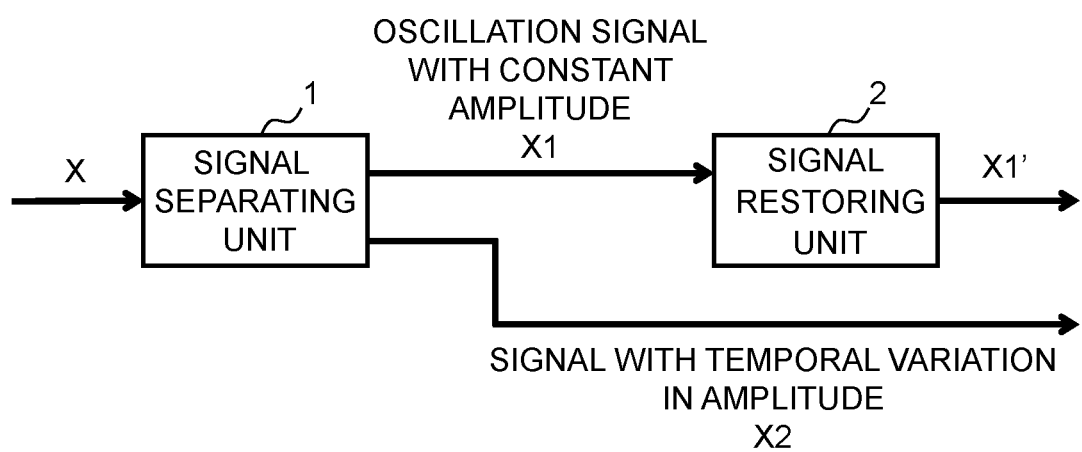
FIG. 1 is a block diagram of a signal processing method according to an Embodiment and an anomaly detecting method using this method.

FIG. 1 is a diagram showing major functions of the signal processing method. It should be noted that each block described below represents a block of a function unit rather than a configuration of a hardware unit.

In an input signal separator (signal separating unit) 1, the signal X is separated into the oscillation signal with a constant amplitude X1 and the signal with temporal variation in amplitude X2. An input signal restorer (signal restoring unit) 2 performs processing of dimensionality reduction, compression, or the like, on the oscillation signal with the constant amplitude X1 so as to extract a feature value (information) included in the oscillation signal X1, and outputs a signal X1' that is restored from the oscillation signal X1 by performing processing inverse to the processing of dimensionality reduction, compression, or the like, on the above-processed oscillation signal X1, based on the extracted feature value (information).

Figure 2:
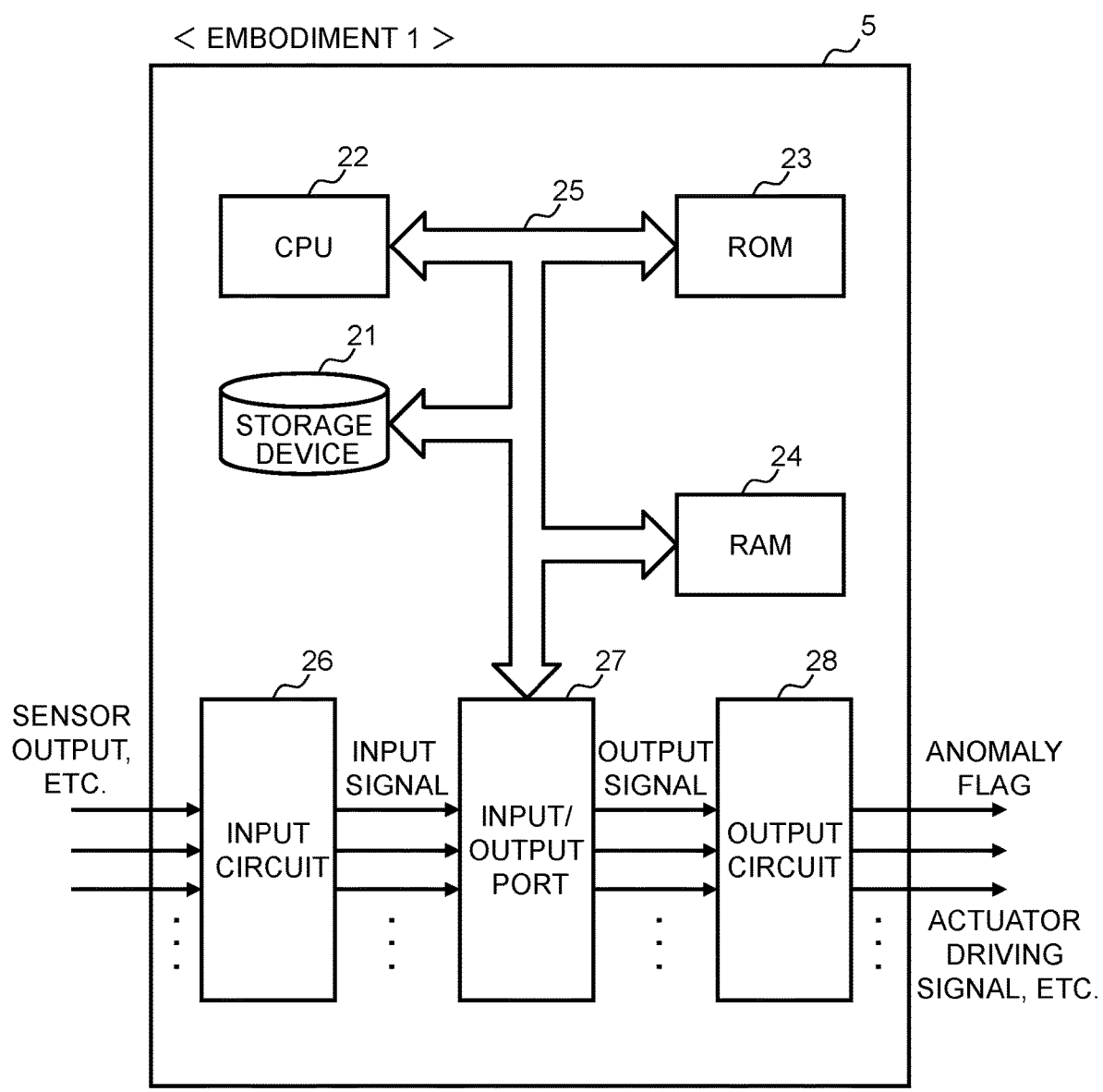
FIG. 2 is a system diagram of the present method in Embodiment 1.

FIG. 2 shows a system diagram of a signal processing and anomaly detecting apparatus 5 implementing the signal processing method and the anomaly detecting method.

The signal processing and anomaly detecting apparatus 5 are provided with an input circuit 26 that processes an external signal. An example of the external signal referred to herein may include a current sensor signal of the AC motor or the like. The external signal passing through the input circuit becomes an input signal and is sent to an input/output port 27. Each input information sent to the input/output port passes through a data bus 25 and is written in a RAM 24. Alternatively, each input information is stored in a storage device 21. Processing described later is written in the ROM 23 or in the storage device 21, and is executed by a CPU 22. At this time, a value written in the RAM 24 or in the storage device 21 is appropriately used for calculation. Of the calculation results, information (value) to be externally sent passes through the data bus 27 to the input/output port 27, and is sent to an output circuit 28 as an output signal. This information (value) is externally output from the output circuit 28 as an external signal. The external signal referred to herein represents an anomaly flag indicating an anomaly detection result, a signal showing (visualizing) which part of the waveform is abnormal, etc.

That is, both the input signal separator (signal separating unit) 1 and the input signal restorer (signal restoring unit) 2 shown in FIG. 1 are realized by executing the processing written in the ROM 23 or in the storage device 21 by the CPU 22, which are all shown in FIG. 2. Similarly, various units and functional units described later are realized by executing the processing written in the ROM 23 or in the storage device 21 by the CPU 22 shown in FIG. 2.

Figure 3:
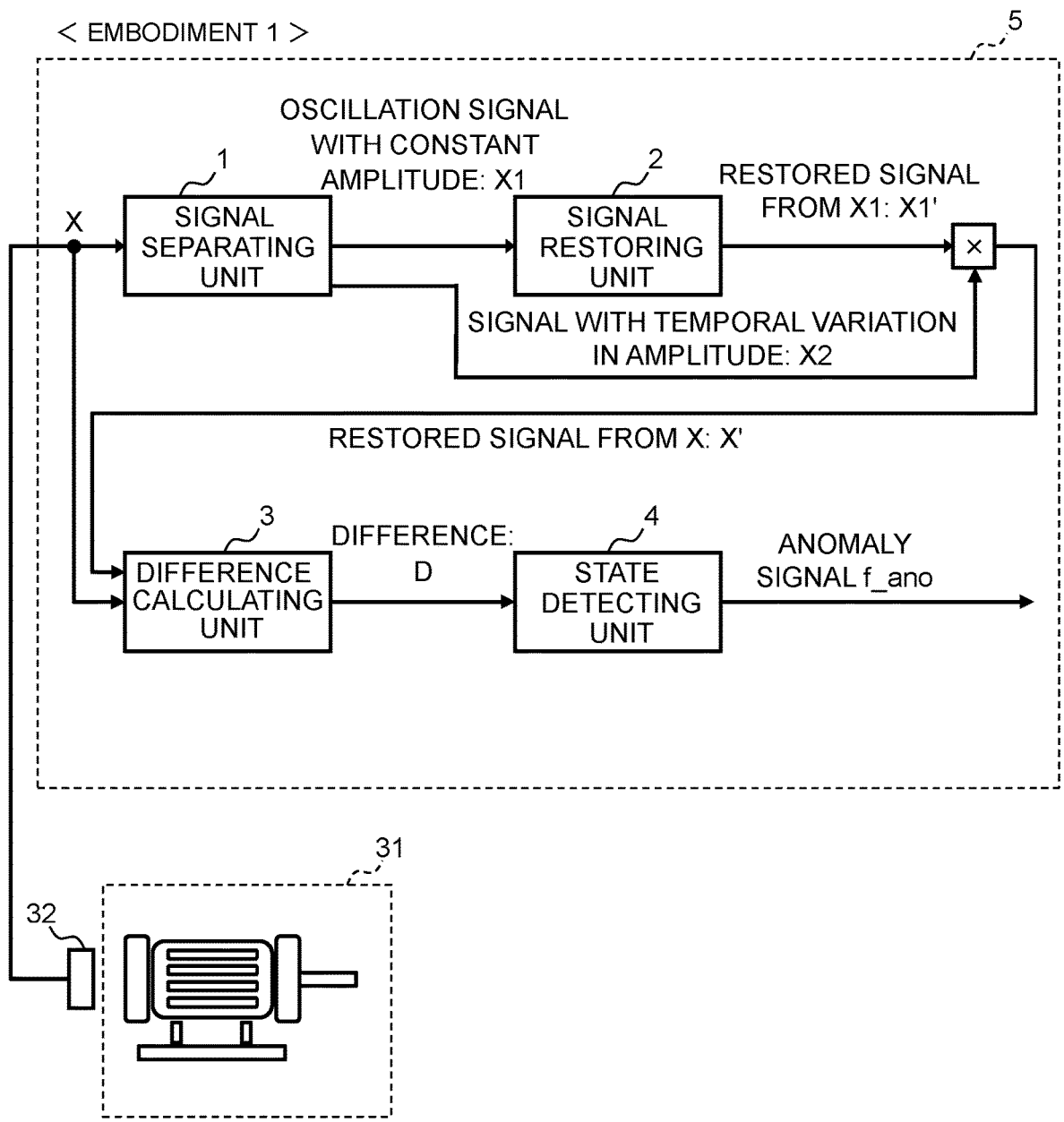
FIG. 3 is a diagram showing the present method and a control target in Embodiment 1.

FIG. 3 shows the signal processing and anomaly detecting apparatus 5 implementing the signal processing method and the anomaly detecting method, and an AC motor 31 on which the apparatus 5 performs the signal processing and the anomaly detection using the signal processing. A current sensor 32 is attached to the AC motor 31, and an output signal of the current sensor 32 is subjected to the signal processing according to the present invention, and the anomaly detection is performed on the AC motor 31 based on the signal-processed signal. In the signal processing and anomaly detecting apparatus 5, the following processing is performed. The output signal X of the current sensor 32 is separated via an input signal separator 1 into the oscillation signal with a constant amplitude X1 and the signal with temporal variation in amplitude X2, as described above. The restored signal X1' from X1 is calculated by an input signal restorer 2. Furthermore, the restored signal X' from X is obtained by multiplying X1' by X2. A difference calculator 3 calculates the difference D based on X' and X. A state detector 4 calculates an anomaly flag f_ano based on the difference D.

Figure 4:
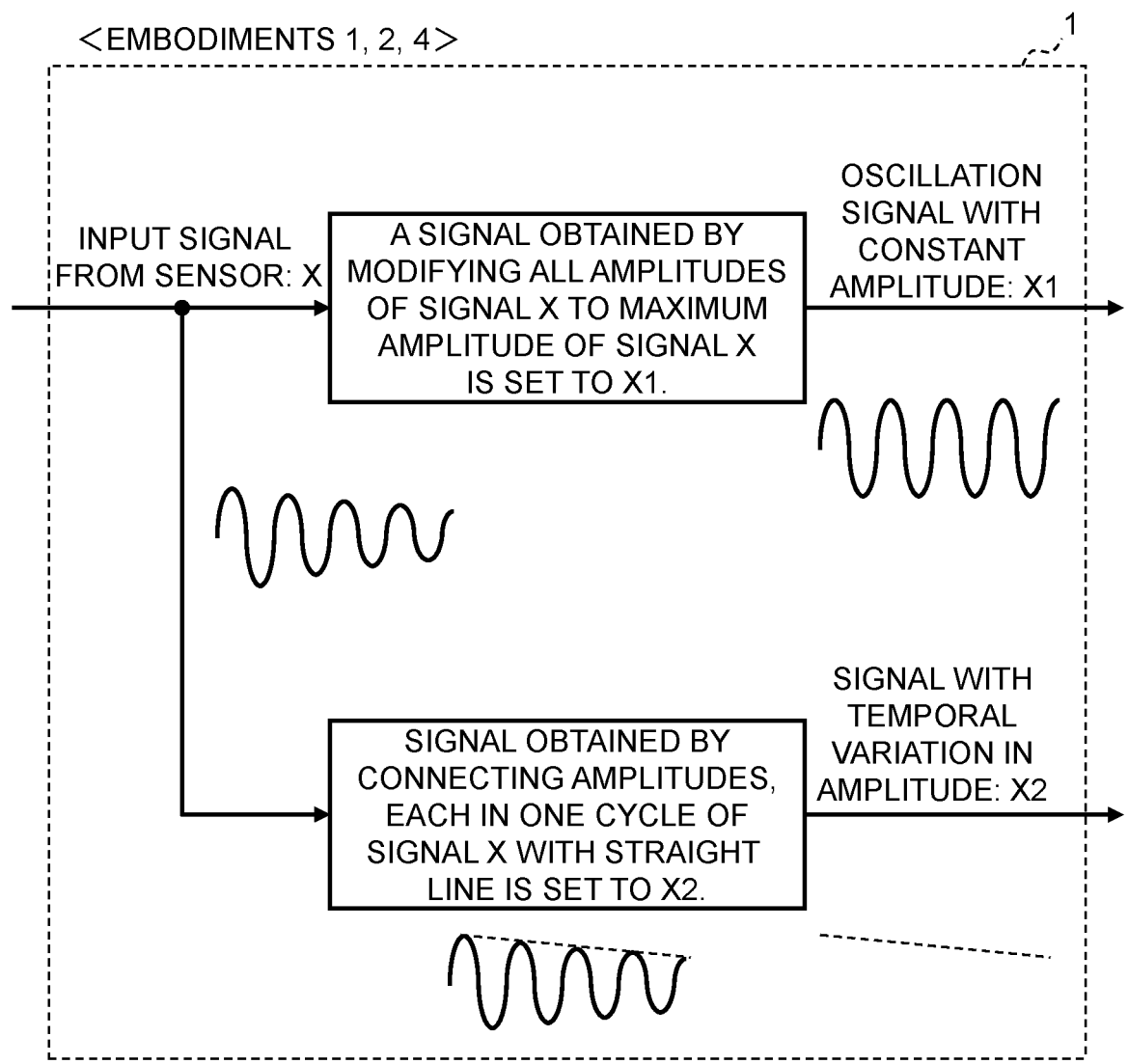
FIG. 4 is a diagram showing processing of an input signal separator in Embodiments 1, 2, 4.

Each processing will be described in detail, hereinafter.
<Input Signal Separator (FIG. 4)>

In the present processing, the output signal X of the current sensor 32 is separated into the oscillation signal with a constant amplitude X1 and the signal with temporal variation in amplitude X2. The present processing is specifically shown in FIG. 4.

A signal obtained by modifying all amplitudes of the signal X to become the maximum amplitude of the signal X is set to X1.

A signal obtained by connecting amplitudes, each in one cycle, of the signal X with a straight line is set to X2.

Figure 5:
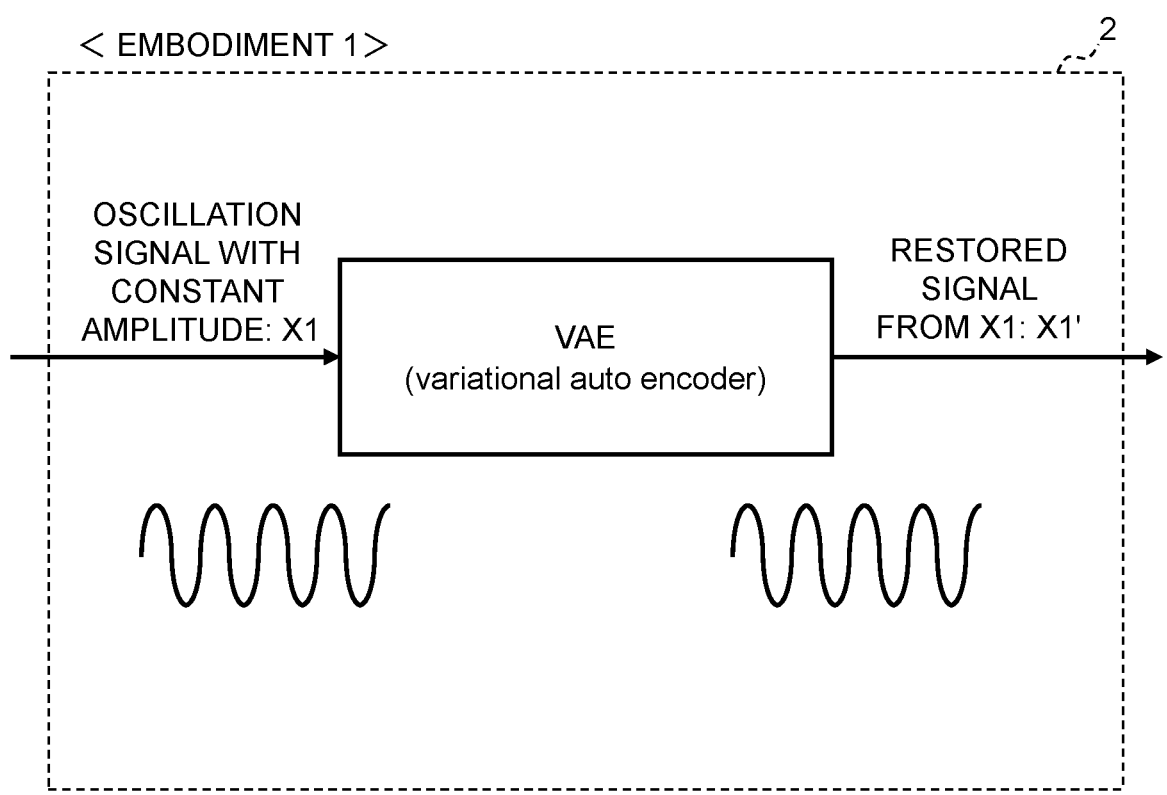
FIG. 5 is a diagram showing processing of an input signal restorer in Embodiment 1.

<Input Signal Restorer (FIG. 5)>

In the present processing, the processing of dimensionality reduction, compression, or the like is performed on the oscillation signal with a constant amplitude X1 so as to extract a feature value (information) included in the oscillation signal X1, and the signal X1', which is restored from the oscillation signal X1 by performing processing inverse to the processing of dimensionality reduction, compression, or the like, on the above-processed oscillation signal based on the extracted feature value (information), is output. The present processing is specifically shown in FIG. 5. A VAE, which is a kind of machine learning, is used for processing for performing the above-described processing. The VAE in FIG. 5 has been already trained using an output signal of the current sensor 32 when the AC motor 31 is normal. That is, when the output signal of the current sensor 32 in a state in which the AC motor 31 is normal is input to the VAE, a signal close to a trained signal is input thereto; therefore, the input signal is accurately restored at the output of the VAE. On the other hand, when a signal in a state in which the AC motor 31 is abnormal (more precisely, a signal other than the normal signal used for the training) is input to the VAE, a signal far (different) from the trained signal is input thereto; therefore, restoration accuracy of the input signal is deteriorated at the output of VAE. Since there are many literatures regarding VAEs, detailed description thereof is omitted now; and as mentioned above, the present input signal restorer has a function of extracting the feature value (information) included in the input signal by subjecting the input signal to the processing of dimensionality reduction, compression, or the like, and outputting the signal that is restored from the input signal by performing the processing inverse to the processing of dimensionality reduction, compression, or the like, on the above-processed input signal based on the extracted feature value (information). As machine learning having the equivalent functions, there are AEs and PCAs, and these may also be used. Since the principle of extracting a feature value is different for each machine learning, the characteristics of a signal to be restored are also different, but each machine learning has the same function in the sense of restoring an input signal.

Figure 6:
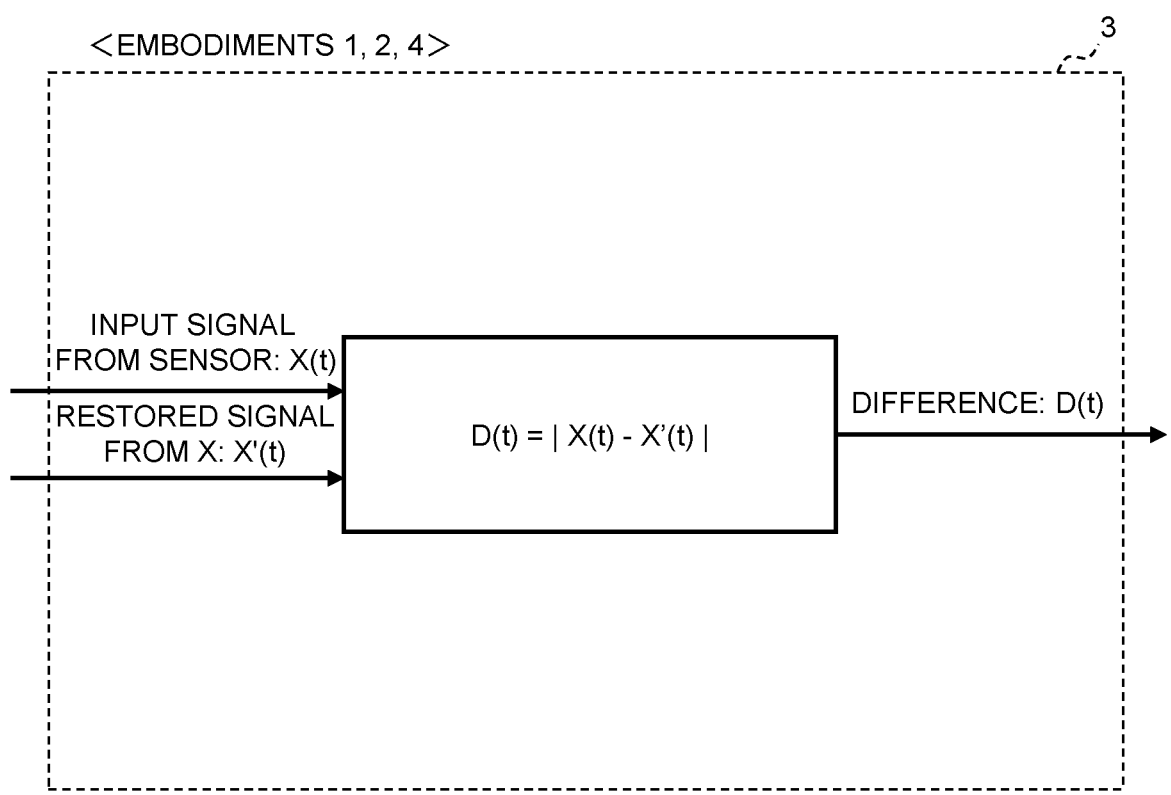
FIG. 6 is a diagram showing processing of a difference calculator in Embodiments 1, 2, 4.

It is understood that when the amplitude of the signal X has an oscillation waveform varying arbitrarily, at least the signal X1 or the signal X1' has an amplitude smaller than the amount of variation in amplitude of the signal X.
<Difference Calculator (FIG. 6)>

In the present processing, the difference D is calculated based on the sensor signal X and the restored signal X'. The present processing is specifically shown in FIG. 6.

$$D(t)=|X(t)-X'(t)| \text{ is set,}$$

where "t" is a time point. That is, D(t) is calculated every sampling period of X.

It should be noted that D(t) is set to an absolute value of the difference, and this may also be a square value of the difference, as in the following equation.

$$D(t)=(X(t)-X'(t))2$$

Figure 7:
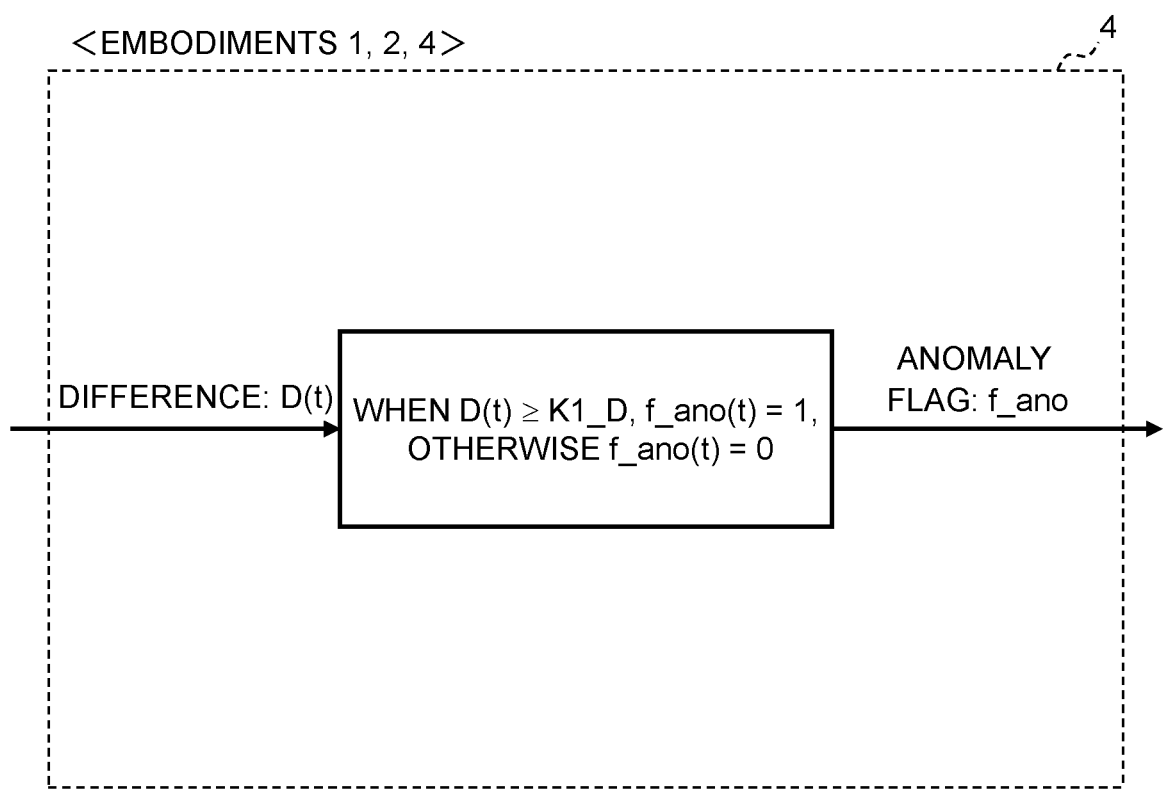
FIG. 7 is a diagram showing processing of a state detector in Embodiments 1, 2, 4.

The difference may also be set to a difference between X1 and X1'.
<State Detector (FIG. 7)>

In the present processing, the anomaly flag f_ano is calculated based on the difference D. The present processing is specifically shown in FIG. 7. When D(t) K1_D, f_ano(t)=1 is set; and otherwise, f_ano(t)=0 is set.

It should be noted that when D(t)≥K1_D is cumulatively established for a predetermined number of times or more, it may be determined that an anomaly has occurred, and f_ano(t)=1 may be set.

Alternatively, when D(t)≥K1_D is established in succession for a predetermined number of times, it may be determined that an anomaly has occurred, and f_ano(t)=1 may be set.

The present Embodiment includes: the signal separator that separates the signal X into the oscillation signal with a constant amplitude X1 and the signal with temporal variation in amplitude X2; and the signal X1 restorer that extracts a feature value (information) included in the oscillation signal X1 by performing the processing of dimensionality reduction, compression, or the like, on at least the oscillation signal X1, and outputs the signal X1' that is restored from the oscillation signal X1 by performing the processing inverse to the processing of dimensionality reduction, compression, or the like, on the above-processed oscillation signal X1 based on the extracted feature value (information). In addition, the present Embodiment includes the signal X restorer that calculates the signal X1' that is restored from the signal X based on the signal X1' restored from the oscillation signal X1 and the signal with temporal variation in amplitude X2. Further, the present Embodiment includes the difference calculator that calculates the difference D between the input signal X and the restored signal X', and detects the state of the transmission source (output source) of the signal X based on the difference D. The difference D is an absolute value of the difference between the input signal X and the restored signal X' at each time point. The signal X1 restorer includes an AE, a VAE, or PCA. The oscillation signal X1 having a waveform with a constant amplitude is a signal obtained by modifying all amplitudes of the signal X to become the maximum amplitude of the signal X. In addition, the signal with temporal variation in amplitude X2 is a signal obtained by connecting amplitudes, each in one cycle, of the signal X with a straight line. The state detector that detects the state of the transmission source of the signal X determines the state of the transmission source of the signal X having the difference D out of a predetermined range to be abnormal. When the amplitude of the signal X has an oscillation waveform varying arbitrarily, at least the signal X1 or the signal X1' has an amplitude smaller than the amount of variation in amplitude of the signal X. In addition, the signal X is drive current of the AC motor.

In the present configuration, after the drive current signal (an oscillation waveform having an amplitude varying over time) of the AC motor is separated into the oscillation signal with a constant amplitude X1 and the signal with temporal variation in amplitude X2, X1 is input to the VAE already trained by using the normal signal so as to generate the restored signal X1' restored from X1. The restored signal X1' is multiplied by the signal with temporal variation in amplitude X2 to generate the restored signal X' from X, and when the difference between X and X' is equal to or larger than the predetermined value, it is determined that an anomaly has occurred in the AC motor.

With the above configuration and operation, even for an oscillation waveform having an amplitude varying over time, highly accurate anomaly detection can be performed on the AC motor by using a VAE, to thereby detect anomaly occurrence in the AC motor at an early stage, which can promote enhancement of reliability on the system using the AC motor.

Embodiment 2

In the present Embodiment, there will be shown a signal processing system and a signal processing method that include: a signal separator (signal separating unit) that separates a signal X into an oscillation signal with a constant amplitude X1 and a signal with temporal variation in amplitude X2; and a signal X1 restorer (signal X1 restoring unit) that performs processing of dimensionality reduction, compression, or the like, on at least the oscillation signal X1 so as to extract a feature value (information) included in the oscillation signal X1, and outputs a signal X1' that is restored from the oscillation signal X1 by performing processing inverse to the processing of dimensionality reduction, compression, or the like, on the above-processed oscillation signal X1 based on the extracted feature value (information).

In particular, the present signal processing system and the present signal processing method include: a signal X1 and signal X2 restorer (signal X2 restoring unit) that performs the processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs a signal X1' that is restored from the oscillation signal X1 and a signal X2' that is restored from the oscillation signal X2 by performing processing inverse to the processing of dimensionality reduction, compression, or the like, on the above-processed oscillation signal X1 and the above-processed oscillation signal X2 based on the extracted feature values (information).

In addition, the present signal processing system and the present signal processing method include: a signal X restorer (signal X restoring unit) that calculates a signal X' that is restored from the signal X based on the restored signal X1' and the restored signal X2'.

The present signal processing system and the present signal processing method include: a difference calculator (difference calculating unit) that calculates a difference D between the input signal X and the restored signal X'; and a state detector (state detecting unit) that detects the state of a transmission source (output source) of the signal X based on the difference D.

The difference D is an absolute value of the difference between the input signal X and the restored signal X' at each time point.

The signal X1 restorer includes an AE, a VAE, or PCA.

The oscillation signal X1 having a waveform with a constant amplitude is a signal obtained by modifying all amplitudes of the signal X to become the maximum amplitude of the signal X.

The signal with temporal variation in amplitude X2 is a signal obtained by connecting respective amplitudes, each in one cycle, of the signal X with a straight line.

The state detector that detects the state of the transmission source of the signal X determines the state of the transmission source of the signal X having the difference D out of a predetermined range to be abnormal.

When the amplitude of the signal X has an oscillation waveform varying arbitrarily, at least the amplitude of the signal X1 or the amplitude of the signal X1' is smaller than the amount of variation in amplitude of the signal X.

The signal X is drive current of an AC motor.

FIG. 2 shows a system diagram implementing the method of the present Embodiment, and the present system is the same as that of Embodiment 1; therefore, detailed description thereof is omitted.

Figure 8:
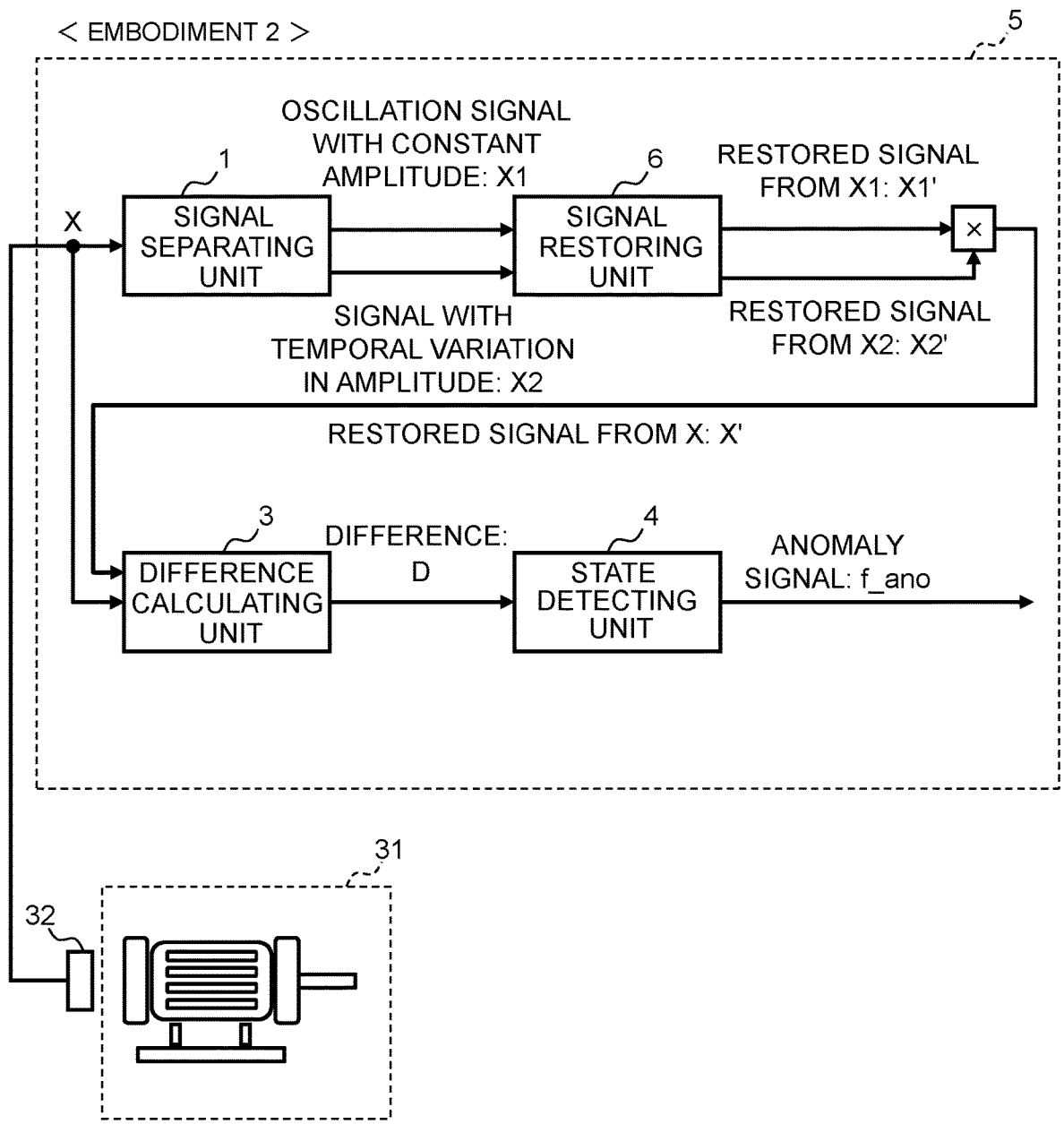
FIG. 8 is a diagram showing the present method and a control target in Embodiment 2.

FIG. 8 shows an apparatus 5 implementing the present method and the AC motor 31 on which the apparatus 5 performs the anomaly detection using the present method. The current sensor 32 is attached to the AC motor 31, and an output signal of the current sensor 32 is subjected to the signal processing according to the present invention, and anomaly detection is performed on the AC motor 31 based on the signal-processed signal. In the signal processing and anomaly detecting apparatus 5, the following processing is performed. The output signal X of the current sensor 32 is separated via the input signal separator 1 into the oscillation signal with a constant amplitude X1 and the signal with temporal variation in amplitude X2, as described above. The restored signal X1' from X1 and the restored signal X2' from X2 are calculated by an input signal restorer 6. Further, the restored signal X' from X is obtained by multiplying X1' by X2'. The difference calculator 3 calculates the difference D based on X' and X. The state detector 4 calculates an anomaly flag f_ano based on the difference D.

Each processing will be described in detail, hereinafter.

<Input Signal Separator (FIG. 4)>

In the present processing, the output signal X of the current sensor 32 is separated into the oscillation signal with a constant amplitude X1 and the signal with temporal variation in amplitude X2. The present processing is specifically shown in FIG. 4, and is the same as that of Embodiment 1; therefore, detailed description thereof is omitted.

Figure 9:
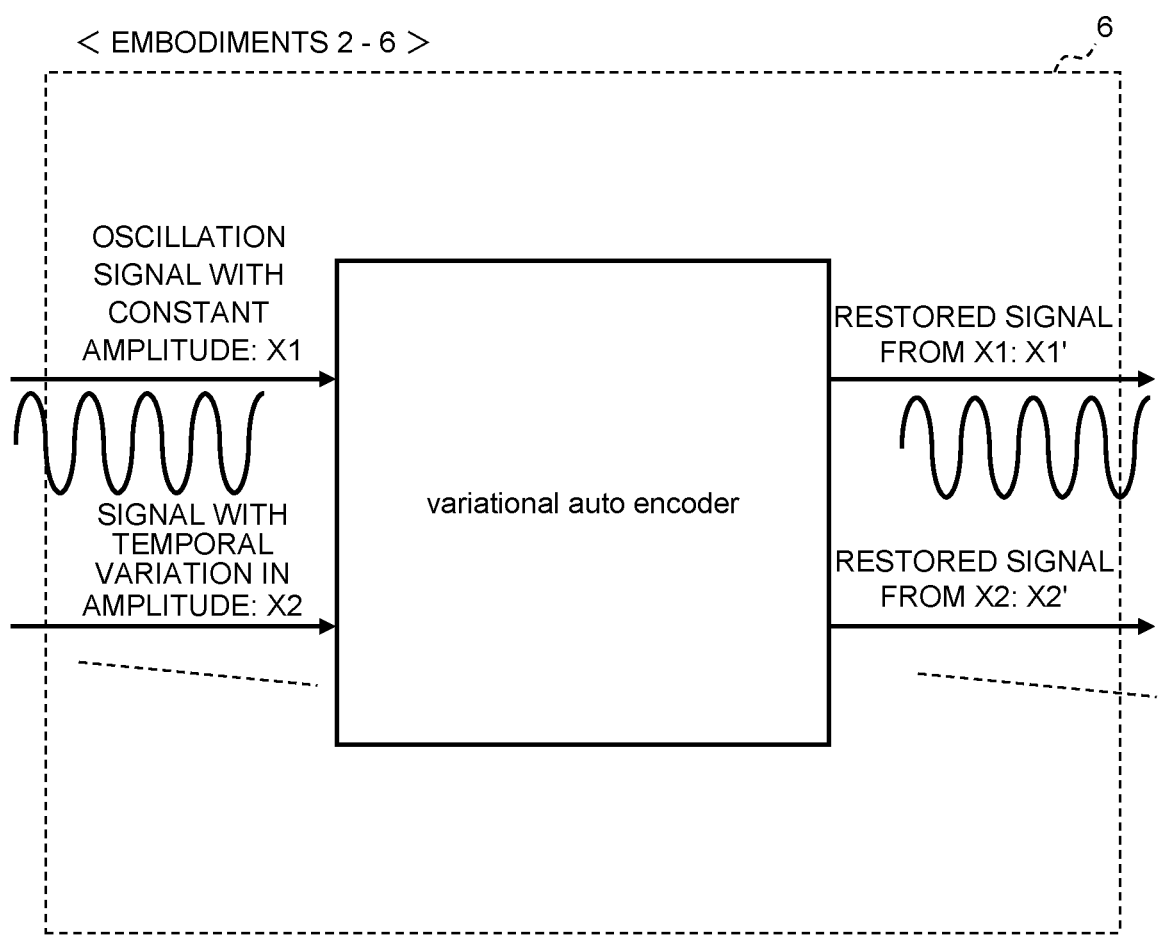
FIG. 9 is a diagram showing processing of the input signal restorer in Embodiments 2 to 6.

<Input Signal Restorer (FIG. 9)>

The present processing performs the processing of dimensionality reduction, compression, or the like on the oscillation signal with a constant amplitude X1 and the signal with temporal variation in amplitude X2 so as to extract feature values (information) included in the oscillation signal X1 and in the signal with temporal variation in amplitude X2, and outputs the signal X1' restored from the oscillation signal X1 and the restored signal X2' restored from the oscillation signal X2, which are restored by performing processing inverse to the processing of dimensionality reduction, compression, or the like, based on the extracted feature values (information). The present processing is specifically shown in FIG. 9. A VAE, which is a kind of machine learning, is used for processing for performing the above-described processing. The VAE in FIG. 9 has been already trained using an output signal of the current sensor 32 when the AC motor 31 is normal. As machine learning having the equivalent functions, there are AEs and PCAs, and these may also be used. Since the principle of extracting a feature value is different for each machine learning, the characteristics of a signal to be restored are also different, but each machine learning has the same function in the sense of restoring an input signal.

<Difference Calculator (FIG. 6)>

In the present processing, the difference D is calculated based on the sensor signal X and the restored signal X'. The present processing is specifically shown in FIG. 6, and is the same as that of Embodiment 1; therefore, detailed description thereof is omitted.

<State Detector (FIG. 7)>

In the present processing, the anomaly flag f_ano is calculated based on the difference D. The present processing is specifically shown in FIG. 7, and is the same as that of Embodiment 1; therefore, detailed description thereof is omitted.

The present Embodiment includes: the signal separator that separates the signal X into the oscillation signal with a constant amplitude X1 and the signal with temporal variation in amplitude X2; and the signal X1 restorer that performs the processing of dimensionality reduction, compression, or the like, on at least the oscillation signal X1 so as to extract a feature value (information) included in the oscillation signal X1, and outputs the signal X1' that is restored from the oscillation signal X1 by performing the processing inverse to the processing of dimensionality reduction, compression, or the like, on the above-processed oscillation signal X1 based on the extracted feature value (information).

In particular, the present Embodiment includes: a signal X1 and signal X2 restorer that performs the processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs a signal X1' that is restored from the oscillation signal X1 and a signal X2' that is restored from the oscillation signal X2 by performing processing inverse to the processing of dimensionality reduction, compression, or the like, on the above-processed signal X1 and on the above-processed signal X2, based on the extracted feature values (information). In addition, the present Embodiment includes the signal X restorer that calculates the signal X1' that is restored from the signal X based on the restored signal X1' and the restored signal X2'. Further, the present Embodiment includes the difference calculator that calculates the difference D between the input signal X and the restored signal X', and detects the state of the transmission source (output source) of the signal X based on the difference D. The difference D is an absolute value of the difference between the input signal X and the restored signal X' at each time point. The signal X1 restorer includes an AE, a VAE, or PCA. The oscillation signal X1 having a waveform with a constant amplitude is a signal obtained by modifying all amplitudes of the signal X to become the maximum amplitude of the signal X. In addition, the signal with temporal variation in amplitude X2 is a signal obtained by connecting amplitudes, each in one cycle, of the signal X with a straight line. The state detector that detects the state of the transmission source of the signal X determines the state of the transmission source of the signal X having the difference D out of a predetermined range to be abnormal. When the amplitude of the signal X has an oscillation waveform varying arbitrarily, at least the signal X1 or the signal X1' has an amplitude smaller than the amount of variation in amplitude of the signal X. In addition, the signal X is drive current of the AC motor.

In the present configuration, after the drive current signal of the AC motor (an oscillation waveform having an amplitude varying over time) is separated into the oscillation signal with a constant amplitude X1 and the signal with temporal variation in amplitude X2, X1 and X2 are input to the VAE already trained by using the normal signal so as to generate the restored signal X1' restored from X1 and the restored signal X2' restored from X2. The restored signal X1' is multiplied by the restored signal X2' restored from the signal with temporal variation in amplitude X2, to thereby generate the restored signal X' from X, and when the difference between X and X' is equal to or larger than the predetermined value, it is determined that an anomaly has occurred in the AC motor. Since X1 and X1' each have a constant amplitude, it is possible to capture temporal variation in frequency of X. At the same time, it is possible to capture temporal variation in amplitude of X2 and X2'.

With the above configuration and operation, even for an oscillation waveform having an amplitude varying over time, highly accurate anomaly detection can be performed on the AC motor by using a VAE, to thereby detect anomaly occurrence in the AC motor at an early stage, which can promote enhancement of reliability on the system using the AC motor.

Embodiment 3

In the present Embodiment, there will be shown a signal processing method including: a signal separator (signal separating unit) that separates a signal X into an oscillation signal with a constant amplitude X1 and a signal with temporal variation in amplitude X2; and a signal X1 restorer (signal X1 restoring unit) that performs processing of dimensionality reduction, compression, or the like, on at least the oscillation signal X1 so as to extract a feature value (information) included in the oscillation signal X1, and outputs a signal X1' that is restored from the oscillation signal X1 by performing processing inverse to the processing of dimensionality reduction, compression, or the like, on the above-processed oscillation signal X1 based on the extracted feature value (information).

In particular, the present signal processing method includes: a signal X1 and signal X2 restorer (signal X1 and signal X2 restoring unit) that performs the processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs a signal X1' that is restored from the oscillation signal X1 and a signal X2' that is restored from the oscillation signal X2 by performing the processing inverse to the processing of dimensionality reduction, compression, or the like, on the above-processed signals X1 and X2 based on the extracted feature values (information).

The present signal processing method includes: the signal X restorer (signal X restoring unit) that calculates a signal X' that is restored from the signal X based on the restored signal X1' and the restored signal X2'.

The present signal processing method includes: a difference calculator (difference calculating unit) that calculates a difference D between the input signal X and the restored signal X'; and a state detector (state detecting unit) that detects the state of a transmission source (output source) of the signal X based on the difference D.

The difference D is a sum of an absolute value of the difference between the input signal X and the restored signal X' at each time point.

The signal X1 restorer includes an AE, a VAE, or PCA.

In particular, the signal with temporal variation in amplitude X2 is an envelope of the signal X.

In particular, the oscillation signal with a constant amplitude X1 and the signal with temporal variation in amplitude X2 are signals obtained by subjecting the signal X to the Hilbert transform.

The state detector that detects the state of the transmission source of the signal X determines the state of the transmission source of the signal X having the difference D out of a predetermined range to be abnormal.

When the amplitude of the signal X has an oscillation waveform varying arbitrarily, at least the amplitude of the signal X1 or the amplitude of the signal X1' is smaller than the amount of variation in amplitude of the signal X.

The signal X is drive current of an AC motor.

FIG. 2 shows a system diagram implementing the method of the present Embodiment, and the present system is the same as that of Embodiment 1; therefore, detailed description thereof is omitted.

Figure 10:
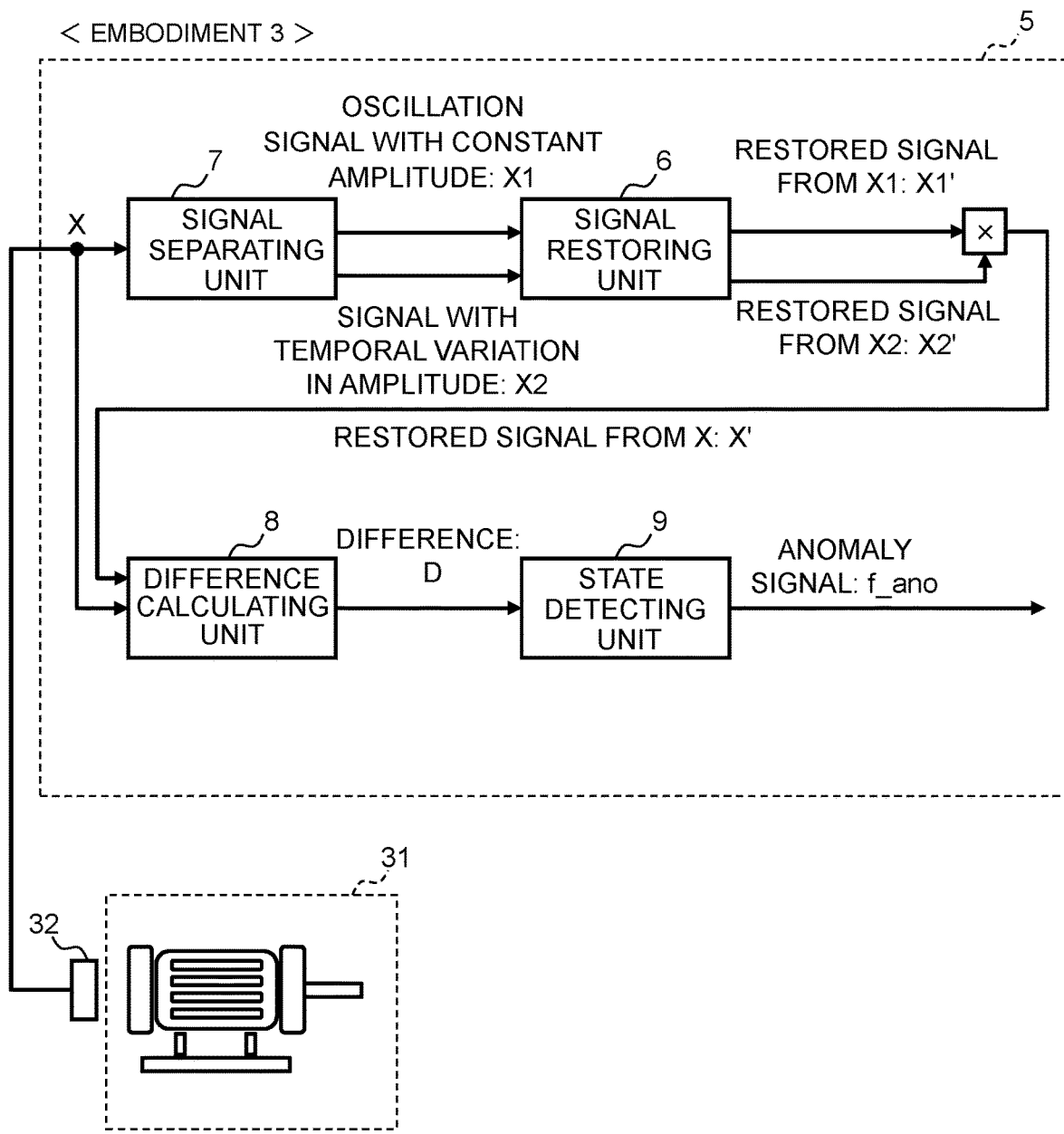
FIG. 10 is a diagram showing the present method and a control target in Embodiment 3.

FIG. 10 shows the apparatus 5 implementing the present method and the AC motor 31 on which the apparatus 5 performs the anomaly detection using the present method. The current sensor 32 is attached to the AC motor 31, and the output signal of the current sensor 32 is subjected to the signal processing according to the present invention, and the anomaly detection is performed on the AC motor 31 based on the signal-processed signal. In the signal processing and anomaly detecting apparatus 5, the following processing is performed. The output signal X of the current sensor 32 is separated via an input signal separator 7 into the oscillation signal with a constant amplitude X1 and the signal with temporal variation in amplitude X2, as described above. The restored signal X1' from X1 and the restored signal X2' from X2 are calculated by the input signal restorer 6. Further, the restored signal X' from X is obtained by multiplying X1' by X2'. A difference calculator 8 calculates the difference D based on X' and X. A state detector 9 calculates an anomaly flag f_ano based on the difference D.

Figure 11:
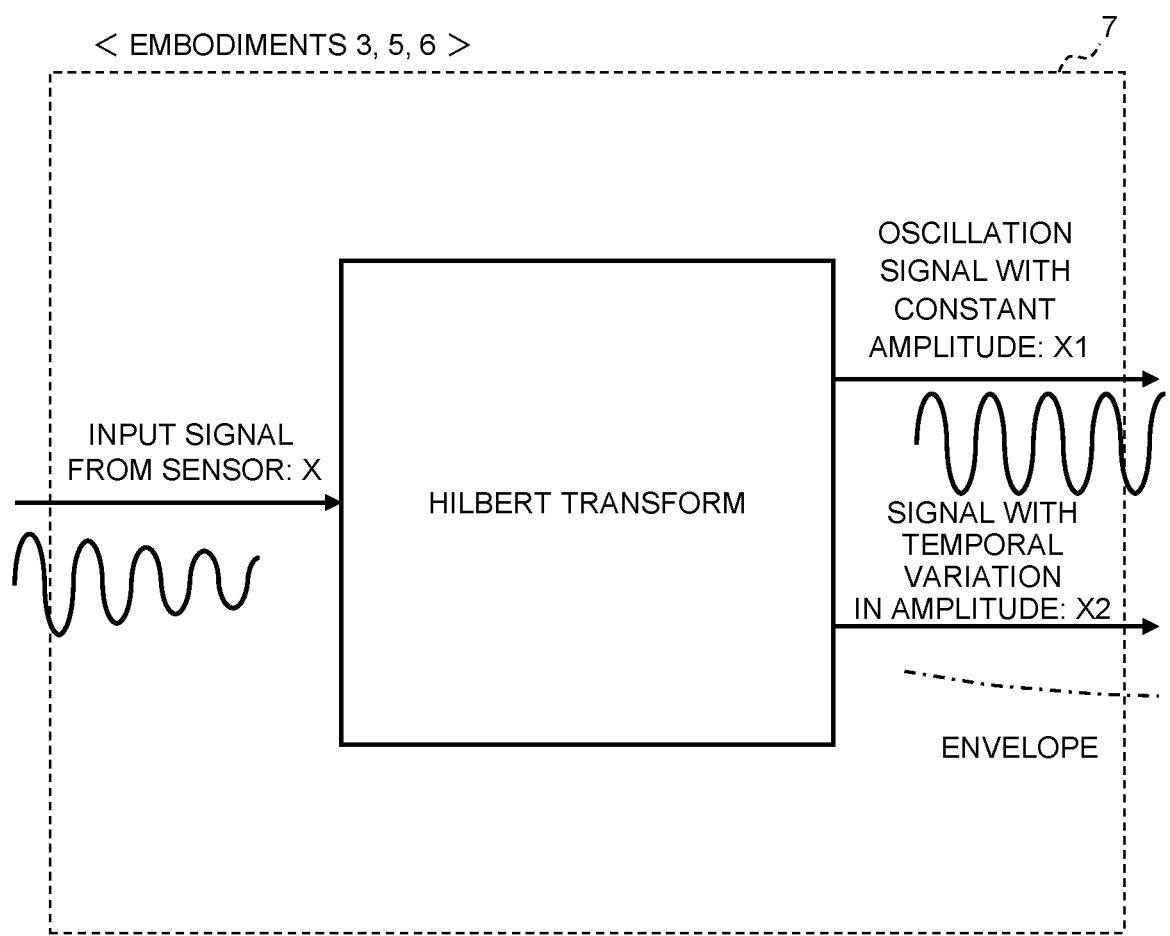
FIG. 11 is a diagram showing processing of an input signal separator in Embodiments 3, 5, 6.

Each processing will be described in detail, hereinafter.
<Input Signal Separator (FIG. 11)>

In the present processing, the output signal X of the current sensor 32 is separated into the oscillation signal with a constant amplitude X1 and the signal with temporal variation in amplitude X2. The present processing is specifically shown in FIG. 11.

The output signal X is separated by using the Hilbert transform into the oscillation signal with a constant amplitude X1 and the signal with temporal variation in amplitude X2. At this time, X2 becomes an envelope of X. Although specific description will be omitted now, there are many literatures about the Hilbert transform; and the Hilbert transform has effect of separating a certain oscillation signal into a signal with a constant amplitude and an envelope thereof.
<Input Signal Restorer (FIG. 9)>

Figure 12:
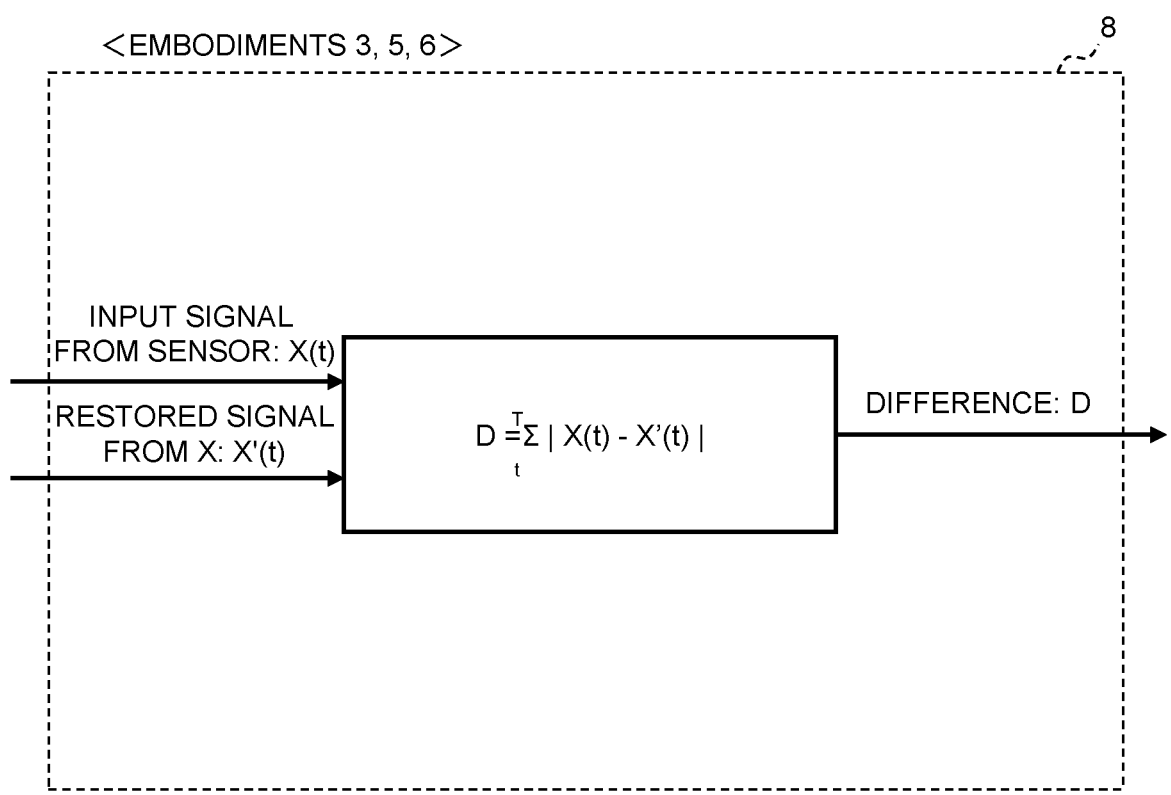
FIG. 12 is a diagram showing processing of a difference calculator in Embodiments 3, 5, 6.

The present processing performs the processing of dimensionality reduction, compression, or the like, on the oscillation signal with a constant amplitude X1 and on the signal with temporal variation in amplitude X2 so as to extract feature values (information) included in the oscillation signal X1 and in the signal with temporal variation in amplitude X2, and outputs the signal X1' that is restored from the oscillation signal X1 and the signal X2' that is restored from the oscillation signal X2 by performing the processing inverse to the processing of dimensionality reduction, compression, or the like, on the above-processed signals X1 and X2, based on the extracted feature values (information). The present processing is specifically shown in FIG. 9, and is the same as that of Embodiment 2; therefore, detailed description thereof is omitted.
<Difference Calculator (FIG. 12)>

In the present processing, the difference D is calculated based on the sensor signal X and the restored signal X'. The present processing is specifically shown in FIG. 12.

$$D=\Sigma|X(t)-X'(t)| \text{ is set,}$$

where "t" is a time point. That is, D is a value obtained by integrating |X(t)−X'(t)|, which is calculated every sampling period of X, for a predetermined period.

It should be noted that D is set to an integrated value of an absolute value of the difference, and may also be an integrated value of a square value of the difference, as in the following equation.

$$D=\Sigma(X(t)-X'(t))2$$

Figure 13:
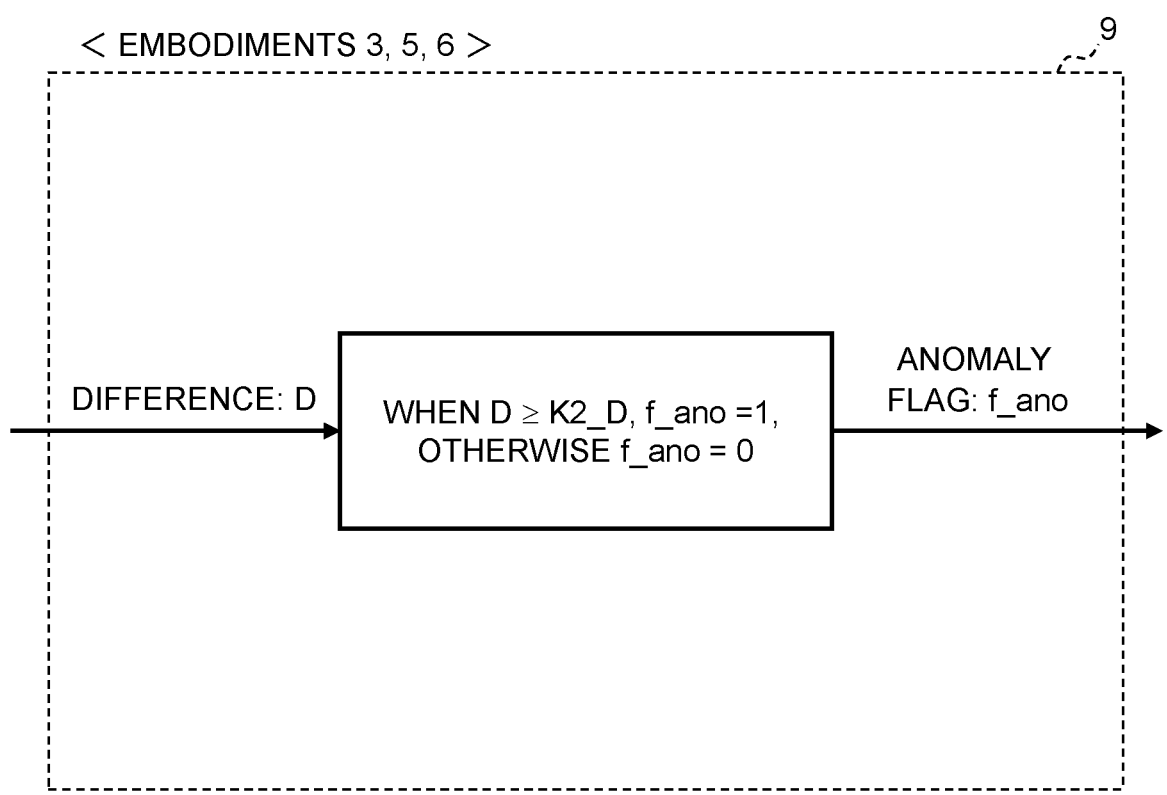
FIG. 13 is a diagram showing processing of a state detector in Embodiments 3, 5, 6.

The difference may also be set to a difference between X1 and X1' or between X2 and X2'.
<State Detector (FIG. 13)>

In the present processing, the anomaly flag f_ano is calculated based on the difference D. The present processing is specifically shown in FIG. 13.

When D≥K2_D, f_ano(t)=1 is set. Otherwise, f_ano(t)=0 is set.

The present Embodiment includes: the signal separator that separates the signal X into the oscillation signal with a constant amplitude X1 and the signal with temporal variation in amplitude X2; and the signal X1 restorer that performs the processing of dimensionality reduction, compression, or the like, on at least the oscillation signal X1 so as to extract a feature value (information) included in the oscillation signal X1, and outputs the signal X1' that is restored from the oscillation signal X1 by performing the processing inverse to the processing of dimensionality reduction, compression, or the like, on the above-processed oscillation signal X1 based on the extracted feature value (information).

In particular, the present Embodiment includes: a signal X1 and signal X2 restorer that performs the processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs a signal X1' that is restored from the oscillation signal X1 and a signal X2' that is restored from the oscillation signal X2 by performing the processing inverse to the processing of dimensionality reduction, compression, or the like, on the above-processed signals X1 and X2, based on the extracted feature values (information). In addition, the present Embodiment includes the signal X restorer that calculates the signal X' that is restored from the signal X based on the restored signal X1' and the restored signal X2'. Further, the present Embodiment includes the difference calculator that calculates the difference D between the input signal X and the restored signal X', and detects the state of the transmission source (output source) of the signal X based on the difference D. In particular, the difference D is a sum of an absolute value of the difference between the input signal X and the restored signal X' at each time point. The signal X1 restorer includes an AE, a VAE, or PCA. In particular, the signal with temporal variation in amplitude X2 is an envelope of the signal X. In particular, the oscillation signal X1 having a waveform with a constant amplitude and the signal with temporal variation in amplitude X2 are signals obtained by subjecting the signal X to the Hilbert transform. In addition, the state detector that detects the state of the transmission source of the signal X determines the state of the transmission source of the signal X having the difference D out of a predetermined range to be abnormal. When the amplitude of the signal X has an oscillation waveform varying arbitrarily, at least the signal X1 or the signal X1' has an amplitude smaller than the amount of variation in amplitude of the signal X. In addition, the signal X is drive current of the AC motor.

In the present configuration, after the drive current signal of the AC motor (an oscillation waveform having an amplitude varying over time) is separated into the oscillation signal with a constant amplitude X1 and the signal with temporal variation in amplitude X2, X1 and X2 are input to the VAE already trained by using the normal signal so as to generate the restored signal X1' restored from X1 and the restored signal X2' restored from X2. The restored signal X1' is multiplied by the restored signal X2' restore from the signal with temporal variation in amplitude X2 so as to generate the restored signal X' from X, and when the difference between X and X' is equal to or larger than a predetermined value, it is determined that an anomaly has occurred in the AC motor. Since X1 and X1' each have a constant amplitude, it is possible to capture temporal variation in frequency of X. At the same time, it is possible to capture temporal variation in amplitude of X2 and X2'. In particular, by using the Hilbert transform for separation of X1 and X2, X2 becomes an envelope; therefore, it is possible to more accurately capture the temporal variation of X.

With the above configuration and operation, even for an oscillation waveform having an amplitude varying over time, highly accurate anomaly detection can be performed on the AC motor by using a VAE, to thereby detect anomaly occurrence in the AC motor at an early stage, which can promote enhancement of reliability on the system using the AC motor.

Embodiment 4

In the present Embodiment, there will be shown a signal processing system and a signal processing method that include: a signal separator (signal separating unit) that separates a signal X into an oscillation signal with a constant amplitude X1 and a signal with temporal variation in amplitude X2; and a signal X1 restorer (signal X1 restoring unit) that performs processing of dimensionality reduction, compression, or the like, on at least an oscillation signal X1 so as to extract a feature value (information) included in the oscillation signal X1, and outputs a signal X1' that is restored from the oscillation signal X1 by performing processing inverse to the processing of dimensionality reduction, compression, or the like, on the above-processed oscillation signal X1 based on the extracted feature value (information).

In particular, the present signal processing system and the present signal processing method include: a signal X1 and signal X2 restorer (signal X1 and signal X2 restoring unit) that performs the processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs a signal X1' that is restored from the oscillation signal X1 and a signal X2' that is restored from the oscillation signal X2 by performing processing inverse to the processing of dimensionality reduction, compression, or the like, on the above-processed signals X1 and X2 based on the extracted feature values (information).

The present signal processing system and the present signal processing method include: a signal X restorer (signal X restoring unit) that calculates a signal X' that is restored from the signal X based on the restored signal X1' and the restored signal X2'.

The present signal processing system and the present signal processing method include: a difference calculator (difference calculating unit) that calculates a difference D between the input signal X and the restored signal X'; and a state detector (state detecting unit) that detects the state of a transmission source (output source) of the signal X based on the difference D.

The difference D is an absolute value of the difference between the input signal X and the restored signal X' at each time point.

The signal X1 restorer includes an AE, a VAE, or PCA.

The oscillation signal X1 having a waveform with a constant amplitude is a signal obtained by modifying all amplitudes of the signal X to become the maximum amplitude of the signal X.

The signal with temporal variation in amplitude X2 is a signal obtained by connecting respective amplitudes, each in one cycle, of the signal X with a straight line.

The state detector that detects the state of the transmission source of the signal X determines the state of the transmission source of the signal X having the difference D out of a predetermined range to be abnormal.

When the amplitude of the signal X has an oscillation waveform varying arbitrarily, at least the signal X1 or the signal X1' has an amplitude smaller than the amount of variation in amplitude of the signal X.

In particular, a time point or a period when the difference D is out of the predetermined range is set to an anomaly occurrence period.

The signal X is drive current of an AC motor.

FIG. 2 shows a system diagram implementing the method of the present Embodiment, and the present system is the same as that of Embodiment 1; therefore, detailed description thereof is omitted.

Figure 14:
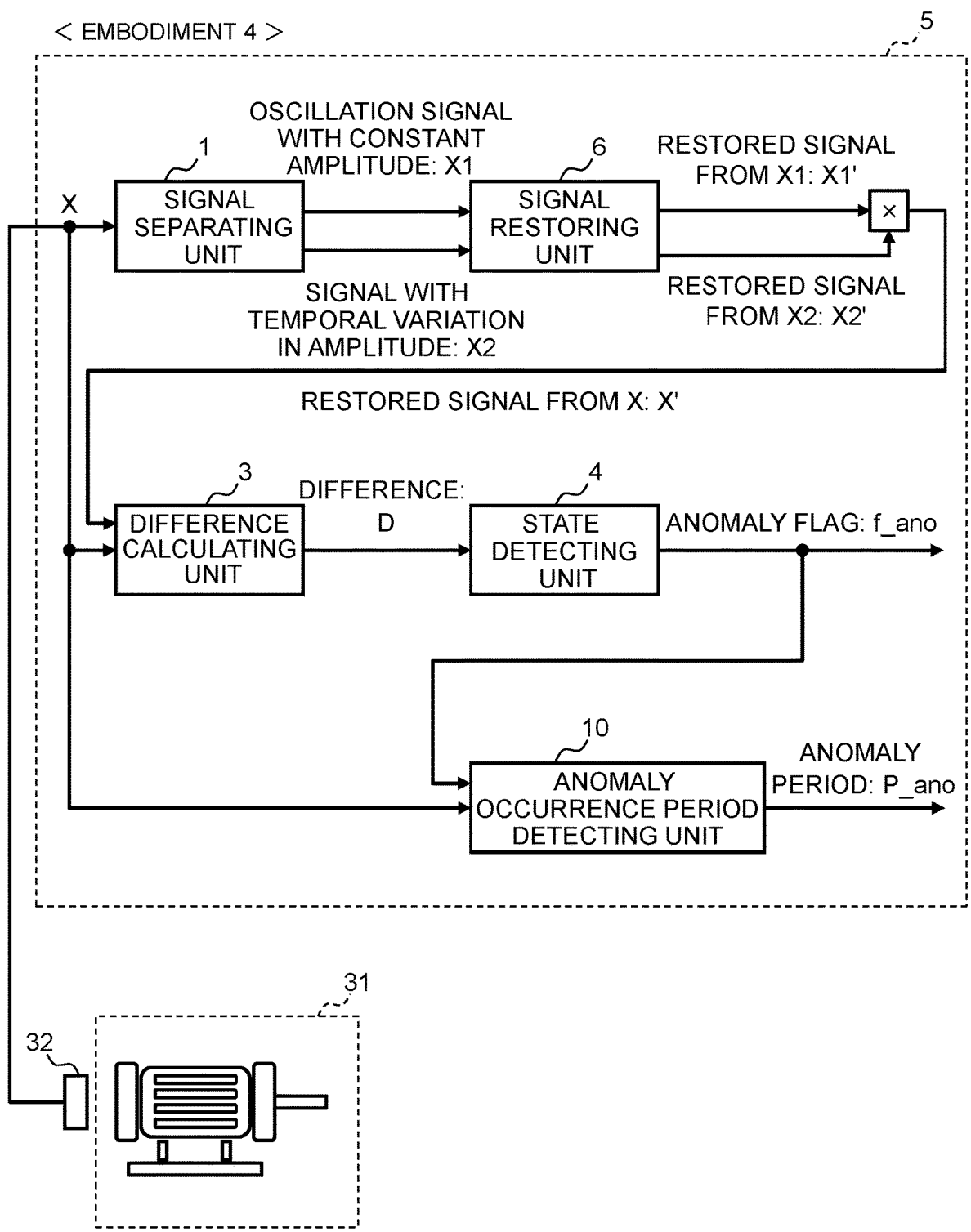
FIG. 14 is a diagram showing the present method and a control target in Embodiment 4.

FIG. 14 shows the apparatus 5 implementing the present method and the AC motor 31 on which the apparatus 5 performs the anomaly detection using the present method. The current sensor 32 is attached to the AC motor 31, and an output signal of the current sensor 32 is subjected to the signal processing according to the present invention, and the anomaly detection is performed on the AC motor 31 based on the signal-processed signal. In the signal processing and anomaly detecting apparatus 5, the following processing is performed. The output signal X of the current sensor 32 is separated via the input signal separator 1 into the oscillation signal with a constant amplitude X1 and the signal with temporal variation in amplitude X2, as described above. The restored signal X1' from X1 and the restored signal X2' from X2 are calculated by the input signal restorer 6. Further, the restored signal X' from X is obtained by multiplying X1' by X2'. The difference calculator 3 calculates the difference D based on X' and X. The state detector 4 calculates an anomaly flag f_ano based on the difference D. An anomaly occurrence period detector 10 calculates an anomaly period P_ano based on the anomaly flag f_ano.

Each processing will be described in detail, hereinafter.

<Input Signal Separator (FIG. 4)>

In the present processing, the output signal X of the current sensor 32 is separated into the oscillation signal with a constant amplitude X1 and the signal with temporal variation in amplitude X2. The present processing is specifically shown in FIG. 4, and is the same as that of Embodiment 1; therefore, detailed description thereof is omitted.

<Input Signal Restorer (FIG. 9)>

The present processing performs the processing of dimensionality reduction, compression, or the like on the oscillation signal with a constant amplitude X1 and the signal with temporal variation in amplitude X2 so as to extract feature values (information) included in the oscillation signal X1 and the signal with temporal variation in amplitude X2, and outputs the signal X1' that is restored from the oscillation signal X1 and the signal X2' that is restored from the oscillation signal X2 by performing processing inverse to the processing of dimensionality reduction, compression, or the like, on the above-processed signals X1 and X2 based on the extracted feature values (information). The present processing is specifically shown in FIG. 9, and is the same as that of Embodiment 2; therefore, detailed description thereof is omitted.

<Difference Calculator (FIG. 6)>

In the present processing, the difference D is calculated based on the sensor signal X and the restored signal X'. The present processing is specifically shown in FIG. 6, and is the same as that of Embodiment 1; therefore, detailed description thereof is omitted.

<State Detector (FIG. 7)>

In the present processing, the anomaly flag f_ano is calculated based on the difference D. The present processing is specifically shown in FIG. 7, and is the same as that of Embodiment 1; therefore, detailed description thereof is omitted.

Figure 15:
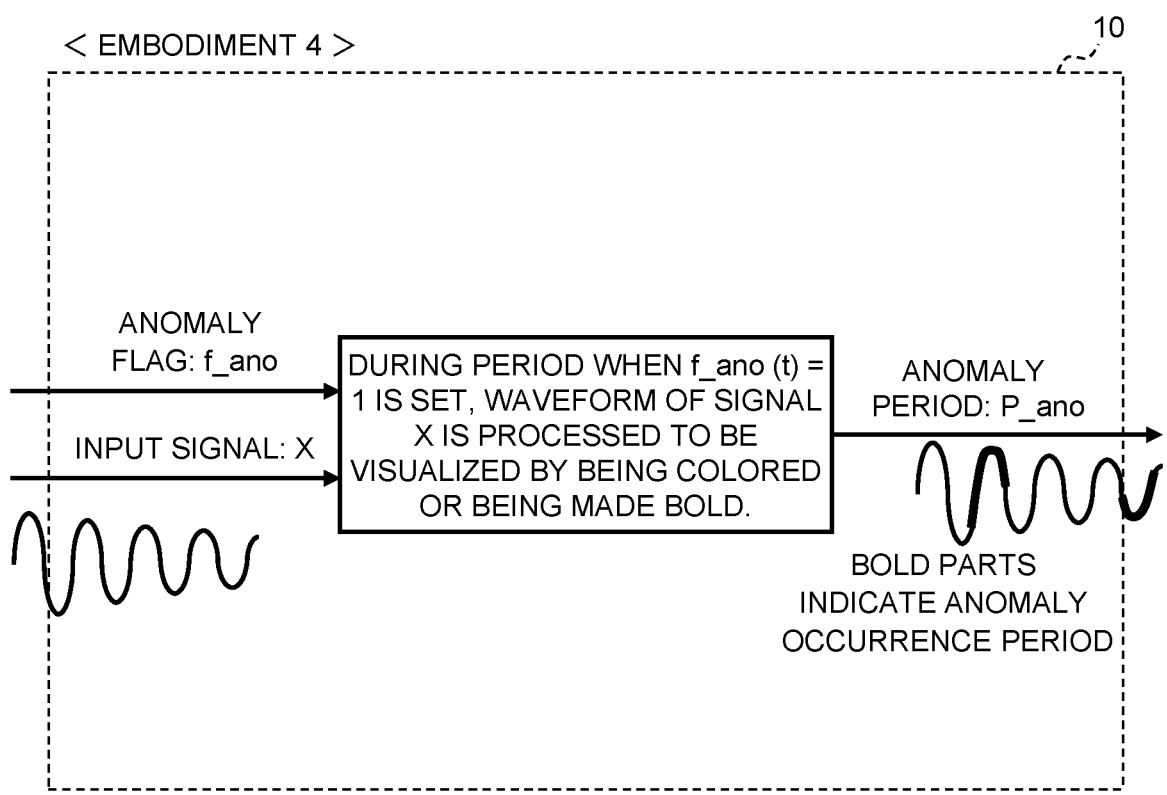
FIG. 15 is a diagram showing processing of an anomaly occurrence period detector in Embodiment 4.

<Anomaly Occurrence Period Detector (FIG. 15)>

In the present processing, the anomaly occurrence period detector 10 calculates the anomaly period P_ano based on the anomaly flag f_ano. The present processing is specifically shown in FIG. 15.

During the period when f_ano(t)=1 is set, processing of adding any information to the signal X so as to visualize the anomaly period by coloring or making a waveform bold, or the like is performed. Alternatively, the signal X(t) and f_ano(t) are vectorized, and they may be used as data representing in which period in the signal X an abnormality has occurred.

The present Embodiment includes: the signal separator that separates the signal X into the oscillation signal with a constant amplitude X1 and the signal with temporal variation in amplitude X2; and the signal X1 restorer that extracts a feature value (information) included in the oscillation signal X1 by performing the processing of dimensionality reduction, compression, or the like, on at least the oscillation signal X1, and outputs the signal X1' that is restored from the oscillation signal X1 by performing the processing inverse to the processing of dimensionality reduction, compression, or the like, on the above-processed oscillation signal X1 based on the extracted feature value (information).

In particular, the present Embodiment includes: a signal X1 and signal X2 restorer that performs the processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs the signal X1' that is restored from the oscillation signal X1 and the signal X2' that is restored from the oscillation signal X2 by performing processing inverse to the processing of dimensionality reduction, compression, or the like, on the above-processed signals X1 and X2 based on the extracted feature values (information). In addition, the present Embodiment includes the signal X restorer that calculates the signal X1' that is restored from the signal X based on the restored signal X1' and the restored signal X2'. Further, the present Embodiment includes the difference calculator that calculates the difference D between the input signal X and the restored signal X', and detects the state of the transmission source (output source) of the signal X based on the difference D. The difference D is an absolute value of the difference between the input signal X and the restored signal X' at each time point. The signal X1 restorer includes an AE, a VAE, or PCA. The oscillation signal X1 having a waveform with a constant amplitude is a signal obtained by modifying all amplitudes of the signal X to become the maximum amplitude of the signal X. In addition, the signal with temporal variation in amplitude X2 is a signal obtained by connecting amplitudes, each in one cycle, of the signal X with a straight line. The state detector that detects the state of the transmission source of the signal X determines the state of the transmission source of the signal X having the difference D out of a predetermined range to be abnormal. When the amplitude of the signal X has an oscillation waveform varying arbitrarily, at least the signal X1 or the signal X1' has an amplitude smaller than the amount of variation in amplitude of the signal X. In particular, a time point or a period when the difference D is out of the predetermined range is set to an anomaly occurrence period. In addition, the signal X is drive current of the AC motor.

In the present configuration, after the drive current signal of the AC motor (an oscillation waveform having an amplitude varying over time) is separated into the oscillation signal with a constant amplitude X1 and the signal with temporal variation in amplitude X2, X1 and X2 are input to the VAE already trained by using the normal signal so as to generate the restored signal X1' restored from X1 and the restored signal X2' restored from X2. The restored signal X1' is multiplied by the restored signal X2' restored from the signal with temporal variation in amplitude X2 so as to generate the restored signal X' from X, and when the difference between X and X' is equal to or larger than the predetermined value, it is determined that an anomaly has occurred in the AC motor. Since X1 and X1' each have a constant amplitude, it is possible to capture temporal variation in frequency of X. At the same time, it is possible to capture temporal variation in amplitude of X2 and X2'. Further, the anomaly occurrence period is visualized.

With the above configuration and operation, even for an oscillation waveform having an amplitude varying over time, highly accurate anomaly detection can be performed on the AC motor by using a VAE, to thereby detect anomaly occurrence in the AC motor at an early stage as well as visualize the anomaly occurrence period, which can promote enhancement of reliability on the system using the AC motor.

Embodiment 5

In the present Embodiment, there will be shown a signal processing system and a signal processing method that include: a signal separator (signal separating unit) that separates a signal X into an oscillation signal with a constant amplitude X1 and a signal with temporal variation in amplitude X2; and a signal X1 restorer (signal X1 restoring unit) that performs processing of dimensionality reduction, compression, or the like, on at least the oscillation signal X1 so as to extract a feature value (information) included in the oscillation signal X1, and outputs a signal X1' that is restored from the oscillation signal X1 by performing processing inverse to the processing of dimensionality reduction, compression, or the like, on the above-processed oscillation signal X1 based on the extracted feature value (information).

In particular, the present signal processing system and the present signal processing method include: a signal X1 and signal X2 restorer (signal X1 and signal X2 restoring unit) that performs the processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs a signal X1' restored from the oscillation signal X1 and a signal X2' restored from the oscillation signal X2 by performing processing inverse to the processing of dimensionality reduction, compression, or the like, on the above-processed signals X1 and X2 based on the extracted feature values (information).

The present signal processing system and the present signal processing method include: a signal X restorer (signal X restoring unit) that calculates a signal X' that is restored from the signal X based on the restored signal X1' and the restored signal X2'.

The present signal processing system and the present signal processing method include: a difference calculator (difference calculating unit) that calculates a difference D between the input signal X and the restored signal X'; and a state detector (state detecting unit) that detects the state of a transmission source (output source) of the signal X based on the difference D.

The difference D is a sum of an absolute value of the difference between the input signal X and the restored signal X' at each time point.

The signal X1 restorer includes an AE, a VAE, or PCA.

The signal with temporal variation in amplitude X2 is an envelope of the signal X.

The oscillation signal with a constant amplitude X1 and the signal with temporal variation in amplitude X2 are signals obtained by subjecting the signal X to the Hilbert transform.

The state detector that detects the state of the transmission source of the signal X determines the state of the transmission source of the signal X having the difference D out of a predetermined range to be abnormal.

When the amplitude of the signal X has an oscillation waveform varying arbitrarily, at least the signal X1 or the signal X1' has an amplitude smaller than the amount of variation in amplitude of the signal X.

In particular, the signal X is drive current of a motor attached to a driving part of a robot.

FIG. 2 shows a system diagram implementing the method of the present Embodiment, and the present system is the same as that of Embodiment 1; therefore, detailed description thereof is omitted.

Figure 16:
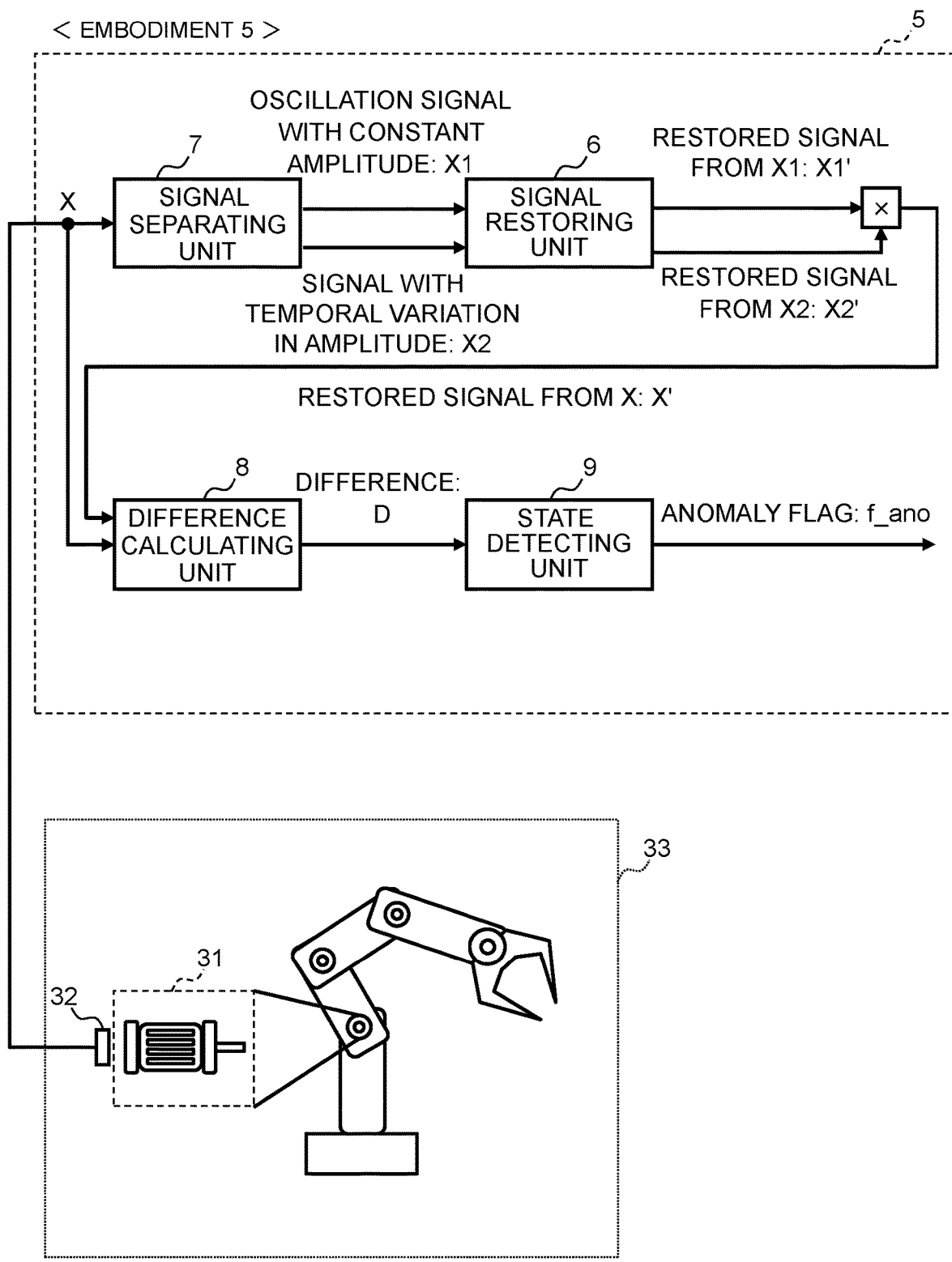
FIG. 16 is a diagram showing the present method and a control target in Embodiment 5.

FIG. 16 shows the apparatus 5 implementing the present method and a drive-current AC motor 31 that is a motor attached to a driving part of a robot 33, and the apparatus 5 performs the anomaly detection on the robot 33 and the AC motor 31 by using the present method. The current sensor 32 is attached to the AC motor 31, which is attached to the driving part of the robot 33, and an output signal of the current sensor 32 is subjected to the signal processing according to the present invention, and the anomaly detection is performed on the AC motor 31 based on the signal-processed signal. In the signal processing and anomaly detecting apparatus 5, the following processing is performed. The output signal X of the current sensor 32 is separated via the input signal separator 7 into the oscillation signal with a constant amplitude X1 and the signal with temporal variation in amplitude X2, as described above. The restored signal X1' from X1 and the restored signal X2' from X2 are calculated by the input signal restorer 6. Further, the restored signal X' from X is obtained by multiplying X1' by X2'. The difference calculator 8 calculates the difference D based on X' and X. The state detector 9 calculates an anomaly flag f_ano based on the difference D.

Each processing will be described in detail, hereinafter.

<Input Signal Separator (FIG. 11)>

In the present processing, the output signal X of the current sensor 32 is separated into the oscillation signal with a constant amplitude X1 and the signal with temporal variation in amplitude X2. The present processing is specifically shown in FIG. 11, and is the same as that of Embodiment 3; therefore, detailed description thereof is omitted.

<Input Signal Restorer (FIG. 9)>

The present processing performs the processing of dimensionality reduction, compression, or the like, on the oscillation signal with a constant amplitude X1 and on the signal with temporal variation in amplitude X2 so as to extract feature values (information) included in the oscillation signal X1 and in the signal with temporal variation in amplitude X2, and outputs the signal X1' that is restored from the oscillation signal X1 and the signal X2' that is restored from the oscillation signal X2 by performing processing inverse to the processing of dimensionality reduction, compression, or the like, on the above-processed signals X1 and X2 based on the extracted feature values (information). The present processing is specifically shown in FIG. 9, and is the same as that of Embodiment 2; therefore, detailed description thereof is omitted.

<Difference Calculator (FIG. 12)>

In the present processing, the difference D is calculated based on the sensor signal X and the restored signal X'. The present processing is specifically shown in FIG. 12, and is the same as that of Embodiment 3, therefore, detailed description thereof is omitted.

<State Detector (FIG. 13)>

In the present processing, the anomaly flag f_ano is calculated based on the difference D. The present processing is specifically shown in FIG. 13, and is the same as that of Embodiment 3, therefore, detailed description thereof is omitted.

The present Embodiment includes: the signal separator that separates the signal X into the oscillation signal with a constant amplitude X1 and the signal with temporal variation in amplitude X2; and the signal X1 restorer that performs the processing of dimensionality reduction, compression, or the like, on at least the oscillation signal X1 so as to extract a feature value (information) included in the oscillation signal X1, and outputs the signal X1' that is restored from the oscillation signal X1 by performing the processing inverse to the processing of dimensionality reduction, compression, or the like, on the above-processed oscillation signal X1 based on the extracted feature value (information).

In particular, the present Embodiment includes: a signal X1 and signal X2 restorer that performs the processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs the signal X1' that is restored from the oscillation signal X1 and the signal X2' that is restored from the oscillation signal X2 by performing the processing inverse to the processing of dimensionality reduction, compression, or the like, on the above-processed signals X1 and X2, based on the extracted feature values (information). In addition, the present Embodiment includes the signal X restorer that calculates the signal X' that is restored from the signal X based on the restored signal X1' and the restored signal X2'. Further, the present Embodiment includes the difference calculator that calculates the difference D between the input signal X and the restored signal X', and detects the state of the transmission source (output source) of the signal X based on the difference D. The difference D is a sum of an absolute value of the difference between the input signal X and the restored signal X' at each time point. The signal X1 restorer includes an AE, a VAE, or PCA. The signal with temporal variation in amplitude X2 is an envelope of the signal X. The oscillation signal X1 having a waveform with a constant amplitude and the signal with temporal variation in amplitude X2 are signals obtained by subjecting the signal X to the Hilbert transform. In addition, the state detector that detects the state of the transmission source of the signal X determines the state of the transmission source of the signal X having the difference D out of a predetermined range to be abnormal. When the amplitude of the signal X has an oscillation waveform varying arbitrarily, at least the signal X1 or the signal X1' has an amplitude smaller than the amount of variation in amplitude of the signal X. In particular, the signal X is drive current of the motor attached to the driving part of the robot 33.

In the present configuration, after the drive current signal of the AC motor (an oscillation waveform having an amplitude varying over time), which is attached to the driving part of the robot 33, is separated into the oscillation signal with a constant amplitude X1 and the signal with temporal variation in amplitude X2, X1 and X2 are input to the VAE already trained by using the normal signal so as to generate the restored signal X1' restored from X1 and the restored signal X2' restored from X2. The restored signal X1' is multiplied by the restored signal X2' restored from the signal with temporal variation in amplitude X2 so as to generate the restored signal X' from X, and when the difference between X and X' is equal to or larger than a predetermined value, it is determined that an anomaly has occurred in the AC motor or in the driving part of the robot 33. Since X1 and X1' each have a constant amplitude, it is possible to capture temporal variation in frequency of X. At the same time, it is possible to capture temporal variation in amplitude of X2 and X2'. In particular, by using the Hilbert transform for separation of X1 and X2, X2 becomes an envelope; therefore, it is possible to more accurately capture the temporal variation of X.

With the above configuration and operation, even for an oscillation waveform having an amplitude varying over time, highly accurate anomaly detection can be performed on the AC motor used for the driving part of the robot 33 by using a VAE, to thereby detect anomaly occurrence in the driving part of the robot 33 at an early stage, which can promote enhancement of reliability on the robot using the AC motor.

In the present Embodiment, only the specific driving part of the robot 33 has been described, but the same processing can also be performed on other joint parts (driving parts) of the robot.

Embodiment 6

In the present Embodiment, there will be shown a signal processing method including: a signal separator (signal separating unit) that separates a signal X into an oscillation signal with a constant amplitude X1 and a signal with temporal variation in amplitude X2; and a signal X1 restorer (signal X1 restoring unit) that performs processing of dimensionality reduction, compression, or the like, on at least the oscillation signal X1 so as to extract a feature value (information) included in the oscillation signal X1, and outputs a signal X1' that is restored from the oscillation signal X1 by performing processing inverse to the processing of dimensionality reduction, compression, or the like, on the above-processed oscillation signal X1 based on the extracted feature value (information).

In particular, the present signal processing method includes: a signal X1 and signal X2 restorer (signal X1 and signal X2 restoring unit) that performs the processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs the signal X1' that is restored from the oscillation signal X1 and the signal X2' that is restored from the oscillation signal X2 by performing the processing inverse to the processing of dimensionality reduction, compression, or the like, on the above-processed signals X1 and X2 based on the extracted feature values (information).

The present signal processing method includes: the signal X restorer (signal X restoring unit) that calculates the signal X' that is restored from the signal X based on the restored signal X1' and the restored signal X2'.

The present signal processing method includes: the difference calculator (difference calculating unit) that calculates a difference D between the input signal X and the restored signal X'; and a state detector (state detecting unit) that detects the state of a transmission source (output source) of the signal X based on the difference D.

The difference D is a sum of an absolute value of the difference between the input signal X and the restored signal X' at each time point.

The signal X1 restorer includes an AE, a VAE, or PCA.

The signal with temporal variation in amplitude X2 is an envelope of the signal X.

The oscillation signal with a constant amplitude X1 and the signal with temporal variation in amplitude X2 are signals obtained by subjecting the signal X to the Hilbert transform.

The state detector that detects the state of the transmission source of the signal X determines the state of the transmission source of the signal X having the difference D out of a predetermined range to be abnormal.

When the amplitude of the signal X has an oscillation waveform varying arbitrarily, at least the signal X1 or the signal X1' has an amplitude smaller than the amount of variation in amplitude of the signal X.

In particular, the signal X is drive current of the motor attached to the driving part of the electric vehicle (EV).

FIG. 2 shows a system diagram implementing the method of the present Embodiment, and the present system is the same as that of Embodiment 1; therefore, detailed description thereof is omitted.

Figure 17:
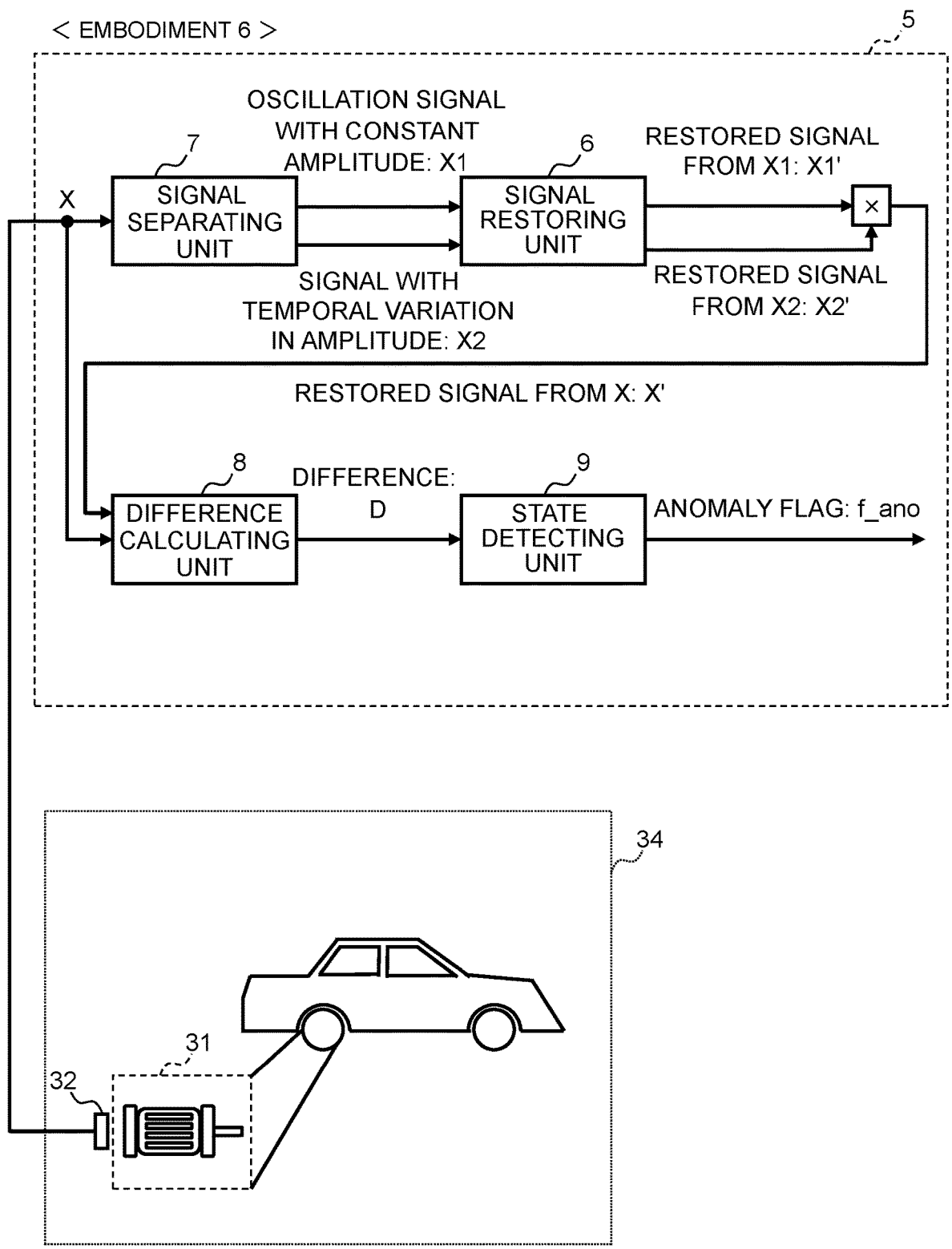
FIG. 17 is a diagram showing the present method and a control target in Embodiment 6.

FIG. 17 shows the apparatus 5 implementing the present method, an electric vehicle 34, and a drive-current AC motor 31 that is a motor attached to a driving part of this vehicle, and the apparatus 5 performs the anomaly detection on the electric vehicle 34 and the AC motor 31 by using the present method. The current sensor 32 is attached to the AC motor 31, which is attached to the driving part of the electric vehicle 34, and an output signal of the current sensor 32 is subjected to the signal processing according to the present invention, and the anomaly detection is performed on the AC motor 31 based on the signal-processed signal. In the signal processing and anomaly detecting apparatus 5, the following processing is performed. The output signal X of the current sensor 32 is separated via the input signal separator 7 into the oscillation signal with a constant amplitude X1 and the signal with temporal variation in amplitude X2, as described above. The restored signal X1' from X1 and the restored signal X2' from X2 are calculated by the input signal restorer 6. Further, the restored signal X' from X is obtained by multiplying X1' by X2'. The difference calculator 8 calculates the difference D based on X' and X. The state detector 9 calculates an anomaly flag f_ano based on the difference D.

Each processing will be described in detail, hereinafter.

<Input Signal Separator (FIG. 11)>

In the present processing, the output signal X of the current sensor 32 is separated into the oscillation signal with a constant amplitude X1 and the signal with temporal variation in amplitude X2. The present processing is specifically shown in FIG. 11, and is the same as that of Embodiment 3; therefore, detailed description thereof is omitted.

<Input Signal Restorer (FIG. 9)>

The present processing performs the processing of dimensionality reduction, compression, or the like, on the oscillation signal with a constant amplitude X1 and on the signal with temporal variation in amplitude X2 so as to extract feature values (information) included in the oscillation signal X1 and in the signal with temporal variation in amplitude X2, and outputs the signal X1' that is restored from the oscillation signal X1 and the signal X2' that is restored from the oscillation signal X2 by performing processing inverse to the processing of dimensionality reduction, compression, or the like, on the above-processed signals X1 and X2 based on the extracted feature values (information). The present processing is specifically shown in FIG. 9, and is the same as that of Embodiment 2; therefore, detailed description thereof is omitted.

<Difference Calculator (FIG. 12)>

In the present processing, the difference D is calculated based on the sensor signal X and the restored signal X'. The present processing is specifically shown in FIG. 12, and is the same as that of Embodiment 3, therefore, detailed description thereof is omitted.

<State Detector (FIG. 13)>

In the present processing, the anomaly flag f_ano is calculated based on the difference D. The present processing is specifically shown in FIG. 13, and is the same as that of Embodiment 3, therefore, detailed description thereof is omitted.

The present Embodiment includes: the signal separator that separates the signal X into the oscillation signal with a constant amplitude X1 and the signal with temporal variation in amplitude X2; and the signal X1 restorer that performs the processing of dimensionality reduction, compression, or the like, on at least the oscillation signal X1 so as to extract a feature value (information) included in the oscillation signal X1, and outputs the signal X1' that is restored from the oscillation signal X1 by performing the processing inverse to the processing of dimensionality reduction, compression, or the like, on the above-processed oscillation signal X1 based on the extracted feature value (information).

In particular, the present Embodiment includes: a signal X1 and signal X2 restorer that performs processing of dimensionality reduction, compression, or the like, on not only the oscillation signal X1 but also the signal with temporal variation in amplitude X2 so as to extract feature values (information) included in the oscillation signal X1 and in the signal with temporal variation in amplitude X2, and outputs a signal X1' that is restored from the oscillation signal X1 and a signal X2' that is restored from the oscillation signal X2 by performing processing inverse to the processing of dimensionality reduction, compression, or the like, on the oscillation signal X1 and on the oscillation signal X2, based on the extracted feature values (information). In addition, the present Embodiment includes the signal X restorer that calculates the signal X' that is restored from the signal X based on the restored signal X1' and the restored signal X2'. Further, the present Embodiment includes the difference calculator that calculates the difference D between the input signal X and the restored signal X', and detects the state of the transmission source (output source) of the signal X based on the difference D. The difference D is a sum of an absolute value of the difference between the input signal X and the restored signal X' at each time point. The signal X1 restorer includes an AE, a VAE, or PCA. The signal with temporal variation in amplitude X2 is an envelope of the signal X. The oscillation signal X1 having a waveform with a constant amplitude and the signal with temporal variation in amplitude X2 are signals obtained by subjecting the signal X to the Hilbert transform. In addition, the state detector that detects the state of the transmission source of the signal X determines the state of the transmission source of the signal X having the difference D out of a predetermined range to be abnormal. When the amplitude of the signal X has an oscillation waveform varying arbitrarily, at least the signal X1 or the signal X1' has an amplitude smaller than the amount of variation in amplitude of the signal X. In particular, the signal X is drive current of the motor attached to the driving part of the electric vehicle 34.

In the present configuration, after the drive current signal of the AC motor (an oscillation waveform having an amplitude varying over time) attached to the driving part of the electric vehicle 34 is separated into the oscillation signal with a constant amplitude X1 and the signal with temporal variation in amplitude X2, X1 and X2 are input to the VAE already trained by using the normal signal so as to generate the restored signal X1' restored from X1 and the restored signal X2' restored from X2. The restored signal X1' is multiplied by the restored signal X2' restored from the signal with temporal variation in amplitude X2 so as to generate the restored signal X' from X, and when the difference between X and X' is equal to or larger than a predetermined value, it is determined that an anomaly has occurred in the AC motor or in the driving part of the electric vehicle 34. Since X1 and X1' each have a constant amplitude, it is possible to capture temporal variation in frequency of X. At the same time, it is possible to capture temporal variation in amplitude of X2 and X2'. In particular, by using the Hilbert transform for separation of X1 and X2, X2 becomes an envelope; therefore, it is possible to more accurately capture the temporal variation of X.

With the above configuration and operation, even for an oscillation waveform having an amplitude varying over time, highly accurate anomaly detection can be performed on the AC motor used for the driving part of the electric vehicle 34 by using a VAE, to thereby detect anomaly occurrence in the driving part of the electric vehicle 34 at an early stage, which can promote enhancement of reliability on the electric vehicle 34 using the AC motor.

In the present Embodiment, only the specific driving part of the electric vehicle 34 has been described, but the same processing can also be performed on other joint parts (driving parts) of the electric vehicle.

Although several Embodiments have been described above, these are examples for explanation of the present invention, and it is not intended to limit the scope of the present invention only to these Embodiments. The present invention can also be carried out in various other forms.

In the above description, a "memory" is one or more memory devices, which are an example of one or more storage devices, and may typically be major memory devices. At least one memory device in the memory may be a volatile memory device or a non-volatile memory device.

In the above description, a "persistent storage" may be one or more persistent storage devices, which are an example of one or more storage devices. The persistent storage device may typically be a non-volatile storage device (e.g., an auxiliary storage device), and specifically, may be an HDD (hard disk drive), an SSD (solid state drive), an NVME (non-volatile memory express) drive, or a SCM (storage class memory), for example.

In the above description, the "storage device" may be at least a memory of a memory and a permanent storage device.

Also, in the above description, the "CPU" may be one or more processor devices (hereinafter, also simply referred to as "processors"). At least one processor device may typically be a microprocessor device, such as a CPU (central processing unit), and may also be another type of processor device, such as a GPU (graphics processing unit). At least one processor device may be a single-core processor device or a multi-core processer device. At least one processor device may be a processor core. At least one processor device may be a processor device in a broad sense, such as a circuit (e.g., an FPGA (field-programmable gate array), a CPLD (complex programmable logic device), or an ASIC (application specific integrated circuit)), which is a collection of gate arrays in a hardware description language that performs part or the whole of processing, may also be used.

Also, in the above description, functions may be each described using an expression like a "yyy unit" or a "yyy-er or -or"; however, each function may be realized by executing one or more computer programs by a processor, or may be realized by one or more hardware circuits (e.g., FPGAs or ASICs), or may be realized by a combination thereof. When a function is realized by executing a program by a processor, the defined processing is performed while a storage device and/or an interface device, etc., are appropriately used; thus, the function may be at least a part of the processor. Processing described by using a function as a subject in a sentence may be processing performed by a processor or a device having a processor. A program may be installed from a program source. A program source may include, for example, a program distribution computer or a computer-readable recording medium (e.g., a non-temporary recording medium). The description on each function is an example thereof, and a plurality of functions may be combined into one function, or one function may be divided into a plurality of functions.

In addition, in the above description, processing may be described by using a "program" as a subject of a sentence in some cases, but the processing described by using the program used as the subject of the sentence may be processing performed by a processor or a device having a processor. Also, two or more programs may be realized as one program, and one program may be realized as two or more programs.

Furthermore, in the above description, a "system" may be a system including one or more physical computers, or may be a system (e.g., a cloud computing system) realized on a physical computing resource group (e.g., a cloud infrastructure). "Displaying" display information, which is performed by a lighting control system, may be displaying display information on a display device included in a computer, or transmitting display information to a display computer, which is performed by a computer (in the latter case, display information is displayed by the display computer).

What is claimed is:

1. A signal processing system comprising:
a signal separating unit that separates an input signal X into an oscillation signal with a constant amplitude X1 and a signal with temporal variation in amplitude X2; and
a signal X1 restoring unit that performs processing of dimensionality reduction, compression, or the like, on at least the oscillation signal with a constant amplitude X1 so as to extract a feature value included in the oscillation signal with a constant amplitude X1, and outputs a restored signal X1' that is restored from the oscillation signal with a constant amplitude X1 by performing processing inverse to the processing of dimensionality reduction, compression, or the like, based on the extracted feature value.

2. The signal processing system according to claim 1, further comprising
a signal X1 and signal X2 restoring unit that
performs the processing of dimensionality reduction, compression, or the like, on the oscillation signal with a constant amplitude X1 and the signal with temporal variation in amplitude X2 so as to extract feature values included in the oscillation signal with a constant amplitude X1 and the signal with temporal variation in amplitude X2, and
outputs the restored signal X1' and a restored signal X2' that is restored from the signal with temporal variation in amplitude X2 by performing processing inverse to the processing of dimensionality reduction, compression, or the like, based on the extracted feature values.

3. The signal processing system according to claim 1, further comprising
a signal X restoring unit that calculates a restored signal X' that is restored from the input signal X based on the restored signal X1' and the signal with temporal variation in amplitude X2.

4. The signal processing system according to claim 1, further comprising:
a signal X1 and signal X2 restoring unit that
performs the processing of dimensionality reduction, compression, or the like, on the oscillation signal with a constant amplitude X1 and the signal with temporal variation in amplitude X2 so as to extract feature values included in the oscillation signal with a constant amplitude X1 and the signal with temporal variation in amplitude X2, and
outputs the restored signal X1' and a restored signal X2' that is restored from the signal with temporal variation in amplitude X2 by performing processing inverse to the processing of dimensionality reduction, compression, or the like, based on the extracted feature values; and
a signal X restoring unit that calculates a restored signal X' that is restored from the input signal X based on the restored signal X1' and the restored signal X2'.

5. The signal processing system according to claim 3, further comprising:
a difference calculating unit that calculates a difference D between the input signal X and the restored signal X'; and
a state detecting unit that detects a state of a transmission source of the input signal X based on the difference D.

6. The signal processing system according to claim 5, wherein
the difference D is at least:
an absolute value of a difference between the oscillation signal with a constant amplitude X1 and the restored signal X1' at each time point; or
a sum of an absolute value of a difference between the oscillation signal with a constant amplitude X1 and the restored signal X1' at each time point; or
a square value of a difference between the oscillation signal with a constant amplitude X1 and the restored signal X1' at each time point; or
a sum of a square value of a difference between the oscillation signal with a constant amplitude X1 and the restored signal X1' at each time point; or
an absolute value of a difference between the signal with temporal variation in amplitude X2 and the restored signal X2' at each time point; or
a sum of an absolute value of a difference between the signal with temporal variation in amplitude X2 and the restored signal X2' at each time point; or
a square value of a difference between the signal with temporal variation in amplitude X2 and the restored signal X2' at each time point; or
a sum of a square value of a difference between the signal with temporal variation in amplitude X2 and the restored signal X2' at each time point; or
an absolute value of a difference between the input signal X and the restored signal X' at each time point; or
a sum of an absolute value of a difference between the input signal X and the restored signal X' at each time point; or
a square value of a difference between the input signal X and the restored signal X' at each time point; or
a sum of a square value of a difference between the input signal X and the restored signal X' at each time point.

7. The signal processing system according to claim 1, wherein
the signal X1 restoring unit includes an AE (auto encoder), a VAE (variational auto encoder), or PCA (principal component analysis).

8. The signal processing system according to claim 1, wherein
the oscillation signal with a constant amplitude X1 is a signal obtained by modifying all amplitudes of the input signal X to become a maximum amplitude of the input signal X.

9. The signal processing system according to claim 1, wherein
the signal with temporal variation in amplitude X2 is a signal obtained by connecting respective amplitudes, each in one cycle, of the input signal X with a straight line, or is an envelope of the input signal X.

10. The signal processing system according to claim 1, wherein
the oscillation signal with a constant amplitude X1 and the signal with temporal variation in amplitude X2 are signals obtained by subjecting the input signal X to a Hilbert transform.

11. The signal processing system according to claim 5, wherein
the state detecting unit determines a state of the transmission source of the input signal X having the difference D out of a predetermined range to be abnormal.

12. The signal processing system according to claim 1, wherein
when the amplitude of the input signal X has an oscillation waveform varying arbitrarily, at least the oscillation signal with a constant amplitude X1 or the restored signal X1' has an amplitude smaller than an amount of variation in amplitude of the input signal X.

13. The signal processing system according to claim 5, wherein
a time point or a period when the difference D is out of a predetermined range is set to an anomaly occurrence period.

14. The signal processing system according to claim 1, wherein
the input signal X is drive current of an AC motor.

15. The signal processing system according to claim 5, wherein
the input signal X is drive current of a motor attached to a driving part of a robot or drive current of a motor for driving an electric vehicle.

16. A signal processing method comprising:
separating an input signal X into an oscillation signal with a constant amplitude X1 and a signal with temporal variation in amplitude X2; and
performing processing of dimensionality reduction, compression, or the like, on at least the oscillation signal with a constant amplitude X1 so as to extract a feature value included in the oscillation signal with a constant amplitude X1; and
outputting a restored signal X1' that is restored from the oscillation signal with a constant amplitude X1 by performing processing inverse to the processing of dimensionality reduction, compression, or the like, based on the extracted feature value.

* * * * *